US012413246B2

(12) United States Patent
Barthe et al.

(10) Patent No.: US 12,413,246 B2
(45) Date of Patent: Sep. 9, 2025

(54) ADAPTIVE SCALING OF PARITY CHECK MESSAGES FOR LDPC DECODING

(71) Applicant: AIRBUS DEFENCE AND SPACE SAS, Toulouse (FR)

(72) Inventors: Lyonel Barthe, Toulouse (FR); Benjamin Gadat, Toulouse (FR)

(73) Assignee: AIRBUS DEFENCE AND SPACE SAS, Toulouse (FR)

( * ) Notice: Subject to any disclaimer, the term of this patent is extended or adjusted under 35 U.S.C. 154(b) by 0 days.

(21) Appl. No.: 18/864,849

(22) PCT Filed: Mar. 23, 2023

(86) PCT No.: PCT/EP2023/057490

§ 371 (c)(1),
(2) Date: Nov. 11, 2024

(87) PCT Pub. No.: WO2023/217447

PCT Pub. Date: Nov. 16, 2023

(65) Prior Publication Data

US 2025/0167808 A1 May 22, 2025

(30) Foreign Application Priority Data

May 12, 2022 (FR) ........................................ 2204541

(51) Int. Cl.
*H03M 13/00* (2006.01)
*H03M 13/11* (2006.01)

(52) U.S. Cl.
CPC ...... *H03M 13/1128* (2013.01); *H03M 13/112* (2013.01); *H03M 13/116* (2013.01)

(58) Field of Classification Search
CPC ......... H03M 13/1154; H03M 13/1128; H03M 13/658; H03M 13/112; H03M 13/116
See application file for complete search history.

(56) References Cited

U.S. PATENT DOCUMENTS 8,190,962 B1 * 5/2012 Chen ................. H03M 13/2906 714/752
8,543,883 B2 * 9/2013 Chen .................... H03M 13/114 714/752

(Continued)

FOREIGN PATENT DOCUMENTS

EP 2381581 A1 10/2011

OTHER PUBLICATIONS

Thien Truong Nguyen Ly "Efficient Hardware Implementations of LDPC Decoders through Exploiting Impreciseness in Message-Passing Decoding Algorithms", Thesis, submitted May 2, 2018, HAL Open Science, Networking and Internet Architecture, Université de Cergy Pontoise, 2017, 163 pages.

(Continued)

*Primary Examiner* — Esaw T Abraham
(74) *Attorney, Agent, or Firm* — Nixon & Vanderhye P.C.

(57) ABSTRACT

The disclosure relates to an LDPC decoding method which involves performing iterations until a stop criterion is satisfied. Each iteration involves calculating variable messages ($\alpha_{n,m}$), calculating parity check messages ($\beta_{m,n}$), and calculating a posteriori estimation variables. The parity check messages ($\beta_{m,n}$) and the posteriori estimation variables (γn) being saturated at a predetermined maximum value. At the end of an iteration, when the number of saturations reaches a specified threshold, the method involves at least a first scaling of the parity check messages ($\beta_{m,n}$) and the a posteriori estimation variables ($\gamma_n$). Scaling corresponds to assigning, to a value, an integer which has the same sign and whose absolute value is the nearest integer greater than the absolute value of the value divided by two.

15 Claims, 16 Drawing Sheets

(56) References Cited

U.S. PATENT DOCUMENTS

Figure 3:
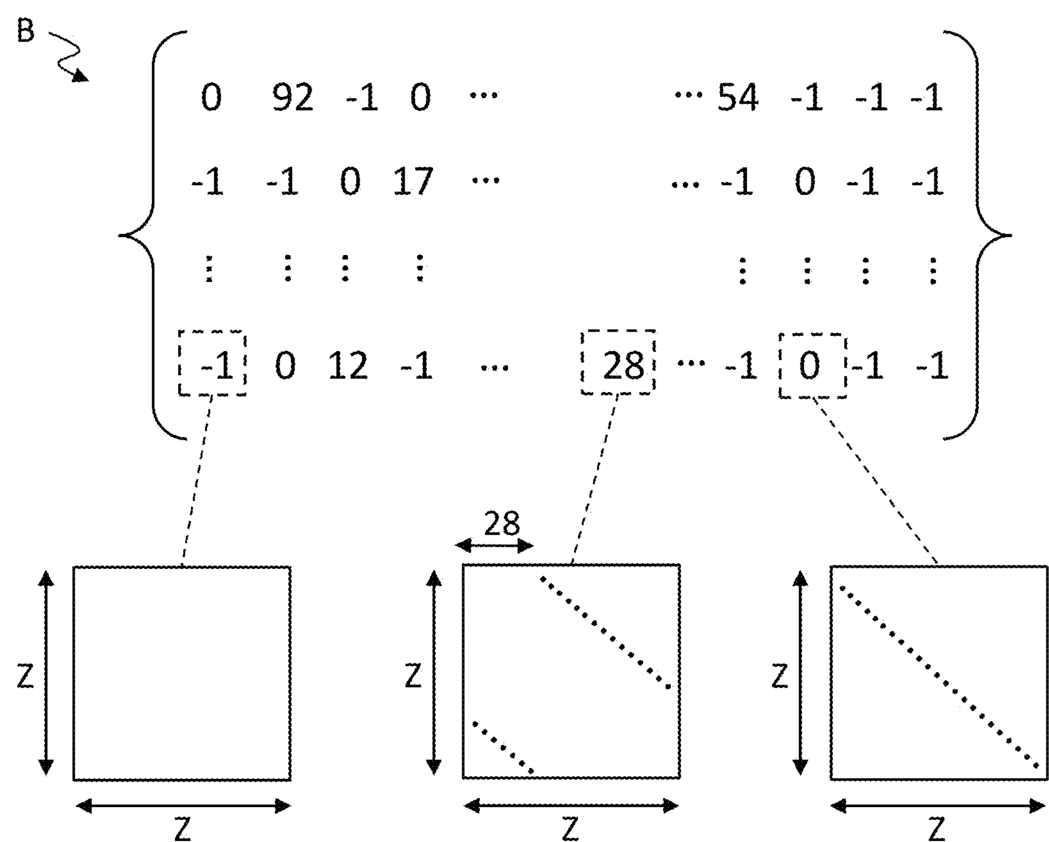

| | | | | |
|---|---|---|---|---|
| 8,825,566 | B2 * | 9/2014 | Jebara | G06N 7/01<br>706/12 |
| 9,048,870 | B2 * | 6/2015 | Li | H03M 13/1117 |
| 9,059,742 | B1 * | 6/2015 | Anderson | H03M 13/3746 |
| 10,063,262 | B2 * | 8/2018 | Morero | H03M 13/616 |
| 10,078,540 | B2 * | 9/2018 | Bisplinghoff | G06F 11/076 |
| 10,263,640 | B2 * | 4/2019 | Djurdjevic | H03M 13/658 |
| 10,566,999 | B2 * | 2/2020 | Jain | H03M 13/616 |
| 2017/0026055 | A1 | 1/2017 | Wu | |

OTHER PUBLICATIONS

Vincent Pignoly, "Etude de codes LPDC pour applications spatiales optiques et conception de decodeurs associes", Thesis submitted Mar. 26, 2021, Electronique, Université de Bordeaux, 147 pages.
Andrei Hera et al. "Analysis and Implementation of On-the-Fly Stopping Criteria for Layered QC LDPC Decoders", Proceedings of the 22nd International Conference "Mixed Design of Integrated Circuits and Systems", Jun. 25-27, 2015, Torun, Poland, 6 pages.
International Search Report with English Translation for PCT/EP2023/057490, mailed Apr. 24, 2023, 4 pages.
Written Opinion of the ISA for PCT/EP2023/057490, mailed Apr. 24, 2023, 8 pages.

* cited by examiner

H
N
$$
\left\{\begin{matrix}
1\;0\;0\;0 & \cdots & 0\;0\;1 & \cdots & 0\;0\;0 \\
0\;1\;0 & \cdots & 1\;0\;0 & \cdots & 0\;0 \\
\vdots\;\vdots\;\vdots & & \vdots\;\vdots\;\vdots & & \vdots\;\vdots \\
0\;0\;0 & \cdots & 1\;0\;1 & \cdots & 0\;0
\end{matrix}\right\}
$$
M
Fig. 1
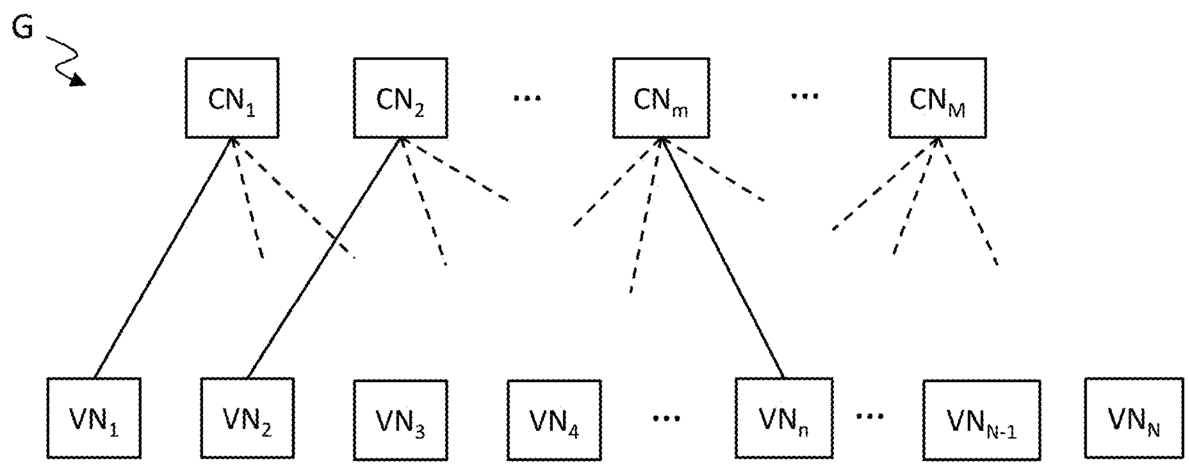
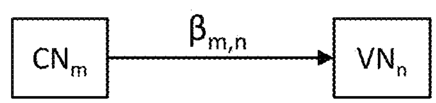
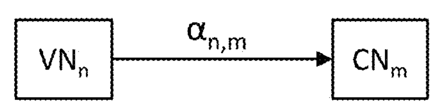
Fig. 2

ADAPTIVE SCALING OF PARITY CHECK MESSAGES FOR LDPC DECODING

CROSS REFERENCE TO RELATED APPLICATIONS

The present application is a National Phase of International Application Number PCT/EP2023/057490, filed Mar. 23, 2023, which designated the U.S. and claims priority benefits from French Application Number FR 2204541 filed May 12, 2022, the entire contents of each of which are hereby incorporated by reference.

FIELD OF THE INVENTION

The present invention belongs to the field of low-density parity check (LDPC, standing for "Low Density Parity Check") codes. In particular, the invention relates to a strategy of quantization on-the-fly of the data used in the decoding process.

PRIOR ART

LDPC codes are currently used in several communication technologies, in particular for IEEE 802.16 (WiMAX), IEE 802.11n (Wi-Fi) standards, the 5G standard of the 3GPP ("3$^{rd}$ Generation Partnership Project") organism, the DVB-S2 ("Digital Video Broadcasting, 2$^{nd}$ Generation") standard, or the space communications standard CCSDS C 2 ("Consultative Committee for Space Data Systems, C2").

A binary LDPC code is a linear error corrector code defined by a binary parity matrix (the elements of the matrix are '0' and '1'). The parity matrix is a low-density matrix, i.e. the number of non-zero elements of the matrix is relatively small compared to the size M×N of the matrix.

An LDPC code may be represented in the form of a bipartite graph (Tanner graph) having connections between N variable nodes and M parity check nodes. Each non-zero element of the parity matrix corresponds to a connection between a variable node and a parity check node. Each line of the parity matrix corresponds to a parity equation associated with a parity check node. Each column of the parity matrix corresponds to a variable associated with a variable node. A codeword to be decoded corresponds to a set of values taken respectively by the variables associated with the different variable nodes (set of the estimated values of the bits of the codeword).

To reduce the hardware implementation complexity of an LDPC decoder, it is known to use particular structures of the parity matrix. In particular, the quasi-cyclic LDPC codes (QC-LDPC, standing for "Quasi-Cyclic Low Density Parity Check") are defined by parity matrices composed of Z×Z size sub-matrices. The term Z is generally so-called "expansion factor". The Z×Z size sub-matrices are generally so-called "circulant matrices". For example, a parity matrix of a QC-LDPC code is obtained from an R×C size base matrix by replacing each element of the base matrix with a Z×Z size matrix corresponding either to a zero matrix or to an offset-shift of the identity matrix. The parity matrix then includes R×Z lines (M=R×Z) and C×Z columns (N=C×Z).

An interesting characteristic of a QC-LDPC code is that its parity matrix is organized into horizontal or vertical layers. For example, a horizontal layer of the parity matrix corresponds to a set of L consecutive lines of the parity matrix originating from a line of the base matrix (L≤Z). This layered structure allows parallelizing the calculations of the parity check messages within a layer because the parity equations of a layer do not involve a variable of the codeword more than once. Indeed, a layer has one single non-zero element in the parity matrix for a given variable, or in other words, the variable nodes connected to a parity check node of one layer are not connected to another parity check node of said layer.

The decoding of an LDPC codeword is based on an iterative exchange of information on the likelihood of the values taken by the bits of the codeword. The iterative decoding process is based on a belief propagation algorithm by exchanging messages between the variable nodes and the parity check nodes, and by applying the parity equations. At each iteration, variable messages are calculated from parity check messages calculated during the previous iteration; the parity check messages are calculated for the current iteration; and variables corresponding to an estimation of the codeword are updated from the parity check messages.

In particular, the iterative process of the decoding of an LDPC codeword may be based on the BP ("Belief Propagation") algorithm, also known under the term SPA ("Sum-Product Algorithm"). The BP-SPA algorithm offers good decoding performances at the expense of a high computational complexity. This computational complexity is related to the use of functions based on hyperbolic tangents or logarithm and exponential functions for the calculation of the parity check messages.

Hence, variants of the BP-SPA algorithm have been proposed to reduce the computational complexity of the decoding.

For example, the algorithms A-min* and λ-min are close to the formulation of the BP-SPA algorithm, but they reduce the computational complexity thereof. In particular, for the λ-min algorithm, only the variable messages with the lowest amplitudes are taken into account for the calculation of a parity check message (the lower the amplitude of a variable message, and the more it will affect the values of the parity check messages).

According to another example, the Min-Sum algorithm replaces the calculations of hyperbolic tangents by calculations of minimums to approximate the parity check messages. This approximation significantly reduces the computational complexity. However, it over-evaluates the amplitudes of the parity check messages, which leads to a decrease in the error correction performances. Hence, variants of the Min-Sum algorithm have been introduced to compensate for this over-evaluation. This is the case in particular of "Offset Min-Sum" (OMS) and "Normalized Min-Sum" (NMS) algorithms. The OMS algorithm introduces a correction value ("offset" in English) to be subtracted from the value calculated for the amplitude of a parity check message. In turn, the NMS algorithm introduces a normalization factor to be applied to the value calculated for the amplitude of a parity check message.

These different algorithms offer different tradeoffs in terms of computational complexity and of correction power. The selection of a particular algorithm is very strongly related to the context in which the LDPC decoding is applied.

To reduce latency and increase the average decoding rate, it is important to limit the number of iterations necessary to correct the errors. This also allows limiting the energy consumption of the decoder. Thus, an important characteristic of an LDPC decoder lies in the criterion used to stop the decoding process, i.e. the criterion used to consider that the convergence to the correct codeword has been reached.

A stop criterion may be determined from a parity check calculation on the set of estimated values of the bits of the codeword at the end of an iteration (the syndrome is then an M size vector defined by the M parity equations defined by the parity matrix). This leads to relatively low error rates. Nonetheless, this leads to an additional latency because the determination of the stop criterion requires interrupting the decoding process at each iteration. In addition, this solution is not well suited to a layered architecture when the size N of a codeword is large.

When the decoding process follows a layered architecture, for example with the use of a QC-LDPC code, it is possible to consider calculating on-the-fly (i.e. without interrupting the decoding process) a partial syndrome for each layer. A partial syndrome is an L size vector defined by the L parity equations of the considered layer (L being the size of the layer, i.e. the number of consecutive lines of the parity matrix corresponding to a layer in the case of a horizontal layered structure).

For example, it is possible to consider that the stop criterion is met when, at the end of an iteration corresponding to the successive processing of the different layers, all of the partial syndromes calculated respectively for the different layers are zero. Nonetheless, there is no guarantee that the partial syndromes are met by the same codeword because the estimates of the values of the bits of the codeword are updated after the processing of each layer. This could lead to a significant increase in false detections.

The article by A. Hera et al. entitled "*Analysis and Implementation of On-the-Fly Stopping Criteria for Layered QC LDPC Decoders*" and published in pages 287 to 291 of the minutes of the 22$^{nd}$ International Conference "Mixed design of integrated circuits and systems" which has been held from June 25th to Jun. 27, 2015 in Torun in Poland, proposes a stop criterion that takes several successive iterations into account. More particularly, the stop criterion is considered to be met when the partial syndromes of the different layers are all zero for a predetermined number of successive iterations. By increasing the number of successive iterations to be considered, it is possible to reduce the error rates at the expense of a greater latency and a lower average flow rate.

To reach high flow rates, and to limit the hardware complexity of the decoder, it is preferable to use a fixed-point representation of the data (parity check messages, variable messages, variables corresponding to an estimation of the codeword). Nonetheless, the fixed-point representation could affect the performances of the decoding in terms of error rates. In particular, the saturation of the data used in the decoding process (when these data reach the maximum value permitted by the fixed-point representation) is at the origin of error rate floor (we then talk about "quantization floor"). Hence, the quantization format of the data should be carefully selected so as to lower the quantization floor while limiting the hardware implementation complexity (when the quantization format is large, there is less saturation and the quantization floor is lower, but the hardware implementation complexity is greater).

The thesis by V. Pignoly entitled "*Etude de codes LPDC pour applications spatiales optiques et conception de decodeurs associes*", submitted on Mar. 26, 2021, presents, in sections 1.3 and 2.1 to 2.3, the LDPC concept, the particular case of the QC-LDPC codes, the principle of decoding in layered scheduling, the different decoding algorithms and the notion of data quantization.

The thesis by T. T. Nguyen Ly thesis entitled "*Efficient Hardware Implementations of LDPC Decoders through Exploiting Impreciseness in Message-Passing Decoding Algorithms*" (hereinafter, referenced by "Ref1") also describes the LDPC decoding principle for a flooding scheduling (cf. sections 2.3.1 and 2.3.3) and for a layered scheduling (cf. section 2.5.2).

Spatial communications impose strong constraints on the channel coding, in particular in terms of correction power, due to the numerous sources of noise that degrade the quality of the transmitted signals and the high cost of a possible retransmission. On the other hand, the flow rates to be reached are increasingly high (the target flow rates may exceed 1 Gbit/s (gigabits per second), and even 10 Gbit/s). Furthermore, the energy consumption and the complexity of the electronic components on board a satellite are generally limited.

The known solutions in terms of stop criterion, decoding algorithm or data quantization strategy do not always allow obtaining an ideal tradeoff between decoding performance, data rate, implementation complexity and energy consumption.

Each of the patent application US2017/026055A1 and the patent U.S. Pat. No. 9,059,742B1 describes a strategy for quantizing the control messages or the estimation variables (LLRs) when a particular saturation criterion is checked.

DISCLOSURE OF THE INVENTION

The present invention aims to overcome all or part of the drawbacks of the prior art, in particular those set out hereinbefore.

To this end, and according to a first aspect, the present invention proposes a method (100) for decoding a codeword with a decoder (10) of low-density parity check code, so-called LDPC code. The LDPC code is defined by an M×N size binary parity matrix (H), M and N being positive integers. The parity matrix (H) corresponds to a representation of a bipartite graph (G) comprising connections between M parity check nodes ($CN_m$) and N variable nodes ($VN_n$). Each line of the parity matrix (H) corresponding to a parity equation associated with a parity check node ($CN_m$). Each column of the parity matrix (H) corresponds to a variable associated with a variable node ($VN_n$). Each non-zero element of the parity matrix (H) corresponds to a connection between a parity check node ($CN_m$) and a variable node ($VN_n$). The codeword to be decoded corresponds to a set of values taken respectively by said variables. The method (100) comprises executing one or more iteration(s) until a stop criterion is met. Each iteration comprises:

- calculating (111) variable messages ($\alpha_{n,m}$), for the different variable nodes ($VN_n$), from parity check messages ($\beta_{m,n}$),
- calculating (112) parity check messages ($\beta_{m,n}$), for the different parity check nodes ($CN_m$), from the variable messages ($\alpha_{n,m}$),
- when the calculated value of a parity check message ($\beta_{m,n}$) or of an a posteriori estimation variable ($\gamma_n$) exceeds a predetermined saturation value, saturating said calculated value at said saturation value,
- calculating (113) a posteriori estimation variables ($\gamma_n$) from the parity check messages ($\beta_{m,n}$), At the end of an iteration, when a saturation criterion is met, the method (100) comprises at least one first scaling (152) of the parity check messages ($\beta_{m,n}$) and of the a posteriori estimation variables ($\gamma_n$). A scaling corresponds to assigning to a value the integer with the same sign whose absolute value is the closest integer greater than the absolute value of the value divided by two. The saturation criterion is met when one or more of the following conditions is met:

a number of saturations of the parity check messages is greater than or equal to a first saturation threshold, a number of saturations of the a posteriori estimation variables is greater than or equal to a second saturation threshold, a sum of the number of saturations of the parity check messages and of the number of saturations of the a posteriori estimation variables is greater than or equal to a third saturation threshold.

This particular method for scaling data on-the-fly allows lowering the error rate floor for a given quantization. It could also allow obtaining performances in terms of error rate floor comparable to that of an upper quantization. This allows for a significant gain on the memory footprint of the decoder at the expense of a relatively low implementation extra cost.

In particular modes of implementation, the invention may further include one or more of the following features, considered separately or according to any technically-feasible combinations.

In particular modes of implementation, following the first scaling of the parity check messages ($\beta_{m,n}$) and of the a posteriori estimation variables ($\gamma_n$), the method comprises at least one second scaling (152) of the parity check messages ($\beta_{m,n}$) and of the a posteriori estimation variables ($\gamma_n$) after a predetermined number of successive iterations.

In particular modes of implementation, the decoder (10) supports different coding rates and the predetermined number of successive iterations is predetermined according to the used coding rate.

In particular modes of implementation, the decoder (10) supports different coding rates and the saturation threshold is predetermined according to the used coding rate.

In particular modes of implementation, the parity matrix (H) has a horizontal layered structure. Each layer corresponds to one or more consecutive line(s) of the parity matrix (H). Each layer has one single non-zero element for a given variable.

In particular modes of implementation, the LDPC code is a quasi-cyclic code. The parity matrix (H) is obtained by extending a R×C size base matrix (B) by an expansion factor Z, Z being a positive integer. Each element of the base matrix (B) is replaced by a Z×Z size matrix corresponding either to a zero matrix, or to an offset-shift of an identity matrix. The parity matrix (H) includes R×Z lines and C×Z columns.

In particular modes of implementation, each layer corresponds to the Z lines of the parity matrix (H) corresponding to a line of the base matrix (B).

In particular modes of implementation, the LDPC code is an irregular code of the "accumulate repeat accumulate" type, so-called LDPC ARA code, or of the "irregular repeat accumulate" type, so-called LPDC IRA code, or of the protograph-based Raptor-like type, so-called LPDC PBRL.

In particular modes of implementation, N is greater than or equal to 1,000.

In particular modes of implementation, the decoder (10) is configured to decode a codeword with a flow rate higher than or equal to 100 Mbit/s.

According to a second aspect, the present invention relates to a decoder (10) of low-density parity check code, so-called LDPC code. The LDPC code is defined by an M×N size binary parity matrix (H), M and N being positive integers. The parity matrix (H) corresponds to a representation of a bipartite graph (G) comprising connections between M parity check nodes ($CN_m$) and N variable nodes ($VN_n$). Each line of the parity matrix (H) corresponds to a parity equation associated with a parity check node ($CN_m$). Each column of the parity matrix (H) corresponds to a variable associated with a variable node ($VN_n$). Each non-zero element of the parity matrix (H) corresponds to a connection between a parity check node ($CN_m$) and a variable node ($VN_n$).

A codeword to be decoded corresponds to a set of values taken respectively by said variables. The decoder (10) includes a processing unit (16) configured to execute one or more iteration(s) until a stop criterion is met and, at each iteration, to:

calculate variable messages ($\alpha_{n,m}$), for the different variable nodes, from parity check messages ($\beta_{m,n}$), calculate parity check messages ($\beta_{m,n}$), for the different parity check nodes, from the variable messages ($\alpha_{n,m}$), when the calculated value of a parity check message ($\beta_{m,n}$) or of an a posteriori estimation variable ($\gamma_n$) exceeds a predetermined saturation value, said calculated value is saturated at said saturation value, calculate a posteriori estimation variables ($\gamma_n$) from the parity check messages ($\beta_{m,n}$).

At the end of an iteration, when a saturation criterion is met, the processing unit (16) is configured to perform a first scaling of the parity check messages ($\beta_{m,n}$) and of the a posteriori estimation variables ($\gamma_n$). A scaling corresponds to assigning to a value the integer with the same sign whose absolute value is the closest integer greater than the absolute value of the value divided by two. The saturation criterion is met when one or more of the following conditions is/are met:

a number of saturations of the parity check messages is greater than or equal to a first saturation threshold, a number of saturations of the a posteriori estimation variables is greater than or equal to a second saturation threshold, a sum of the number of saturations of the parity check messages and of the number of saturations of the a posteriori estimation variables is greater than or equal to a third saturation threshold.

In particular embodiments, the invention may further include one or more of the following features, considered separately or according to any technically-feasible combinations.

In particular embodiments, following the first scaling of the parity check messages ($\beta_{m,n}$) and of the a posteriori estimation variables ($\gamma_n$), the processing unit is configured to perform at least one second scaling of the parity check messages ($\beta_{m,n}$) and of the a posteriori estimation variables ($\gamma_n$) after a predetermined number of successive iterations.

In particular embodiments, the decoder (10) supports different coding rates and the predetermined number of successive iterations is predetermined according to the coding rate used.

In particular embodiments, the decoder (10) supports different coding rates and the saturation threshold is predetermined according to the coding rate used.

According to a second aspect, the present invention relates to a satellite including a decoder (10) according to any one of the preceding embodiments.

PRESENTATION OF THE FIGURES

Figure 4:
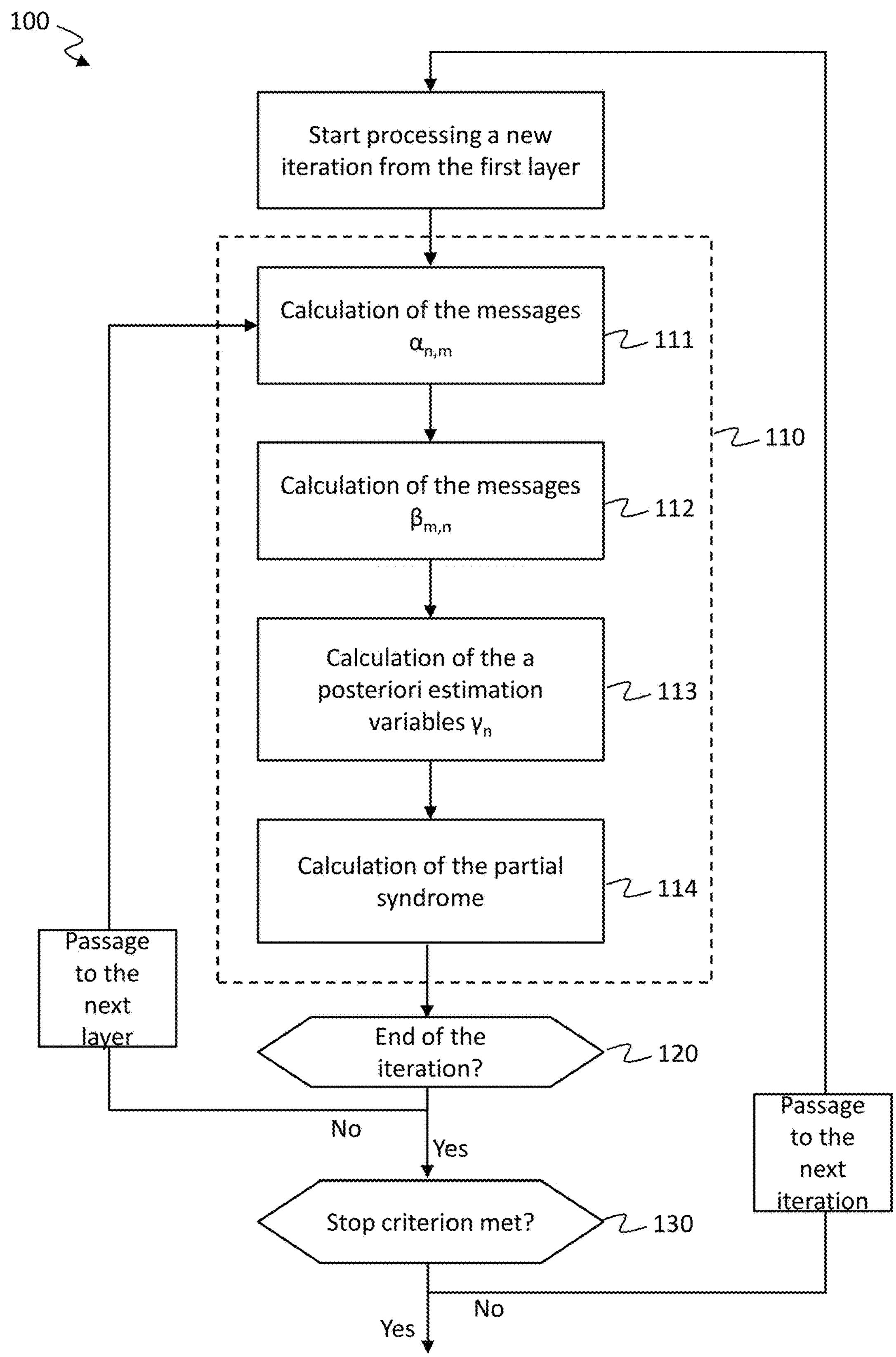
Figure 5:
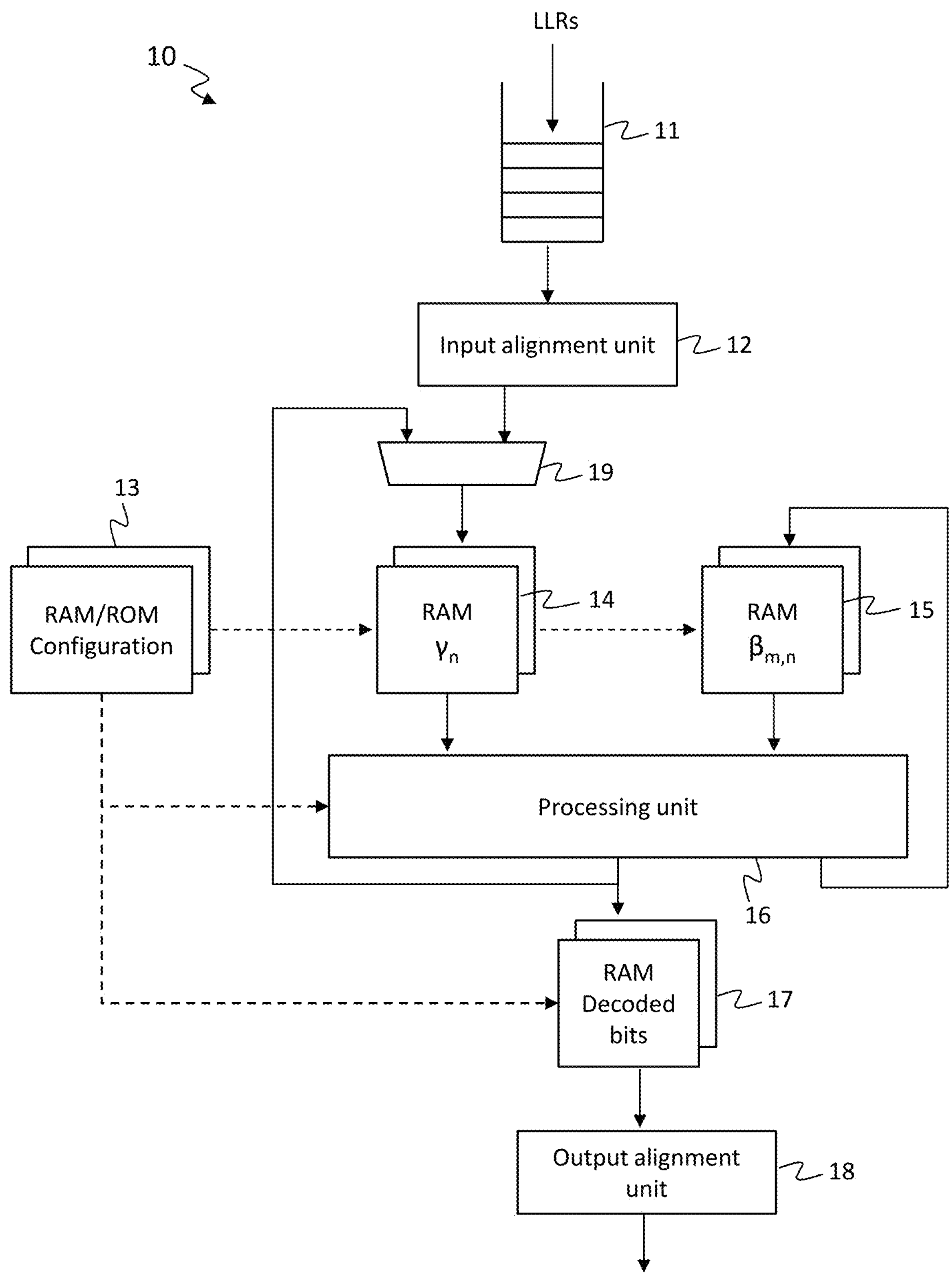
Figure 6:
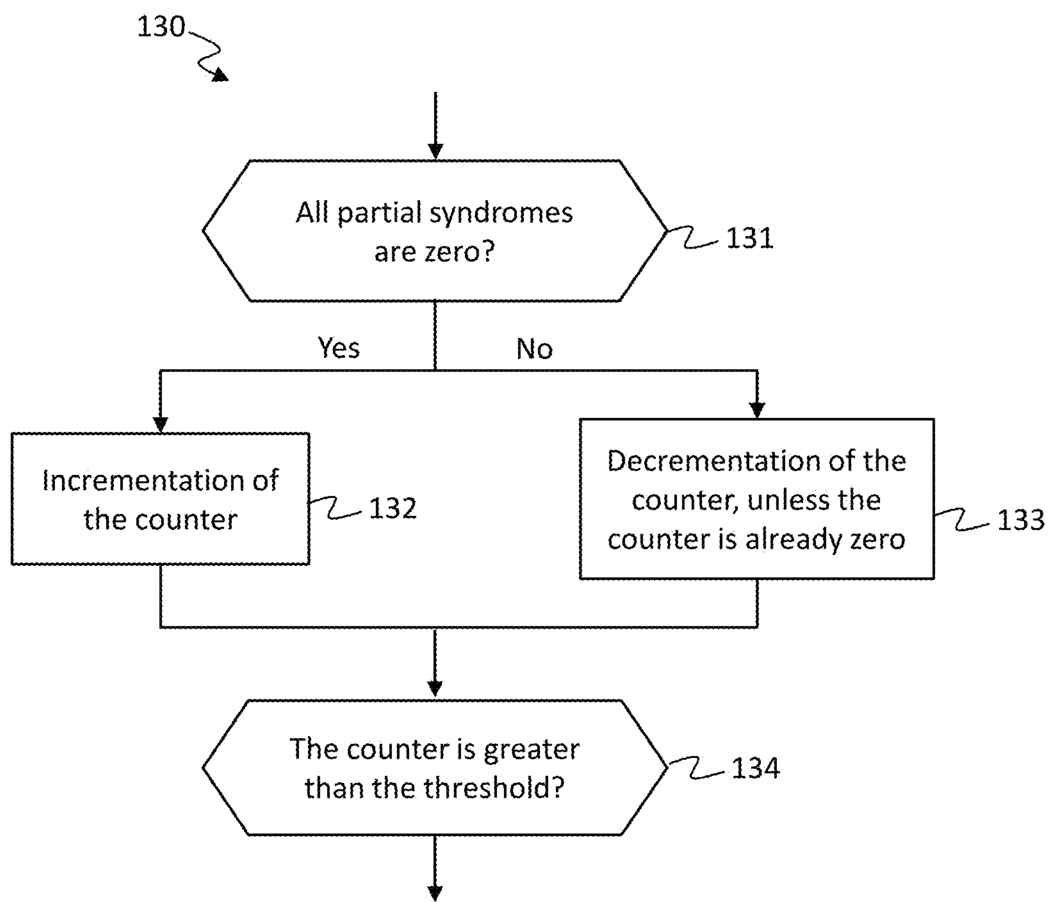
Figure 7:
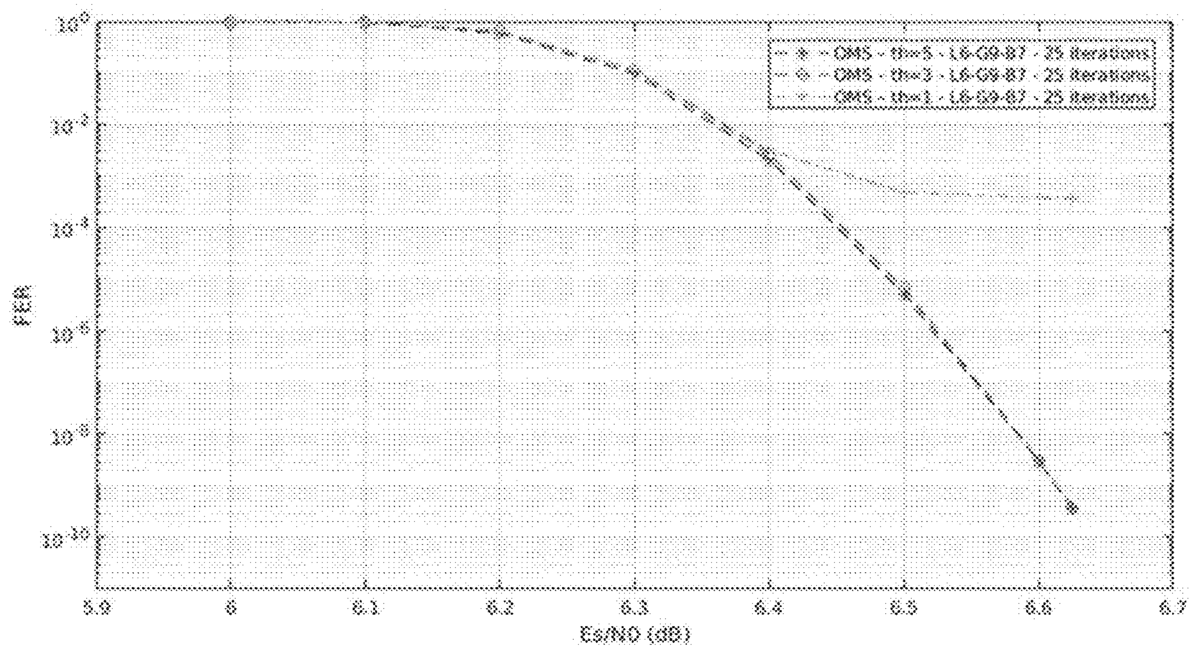
Figure 8:
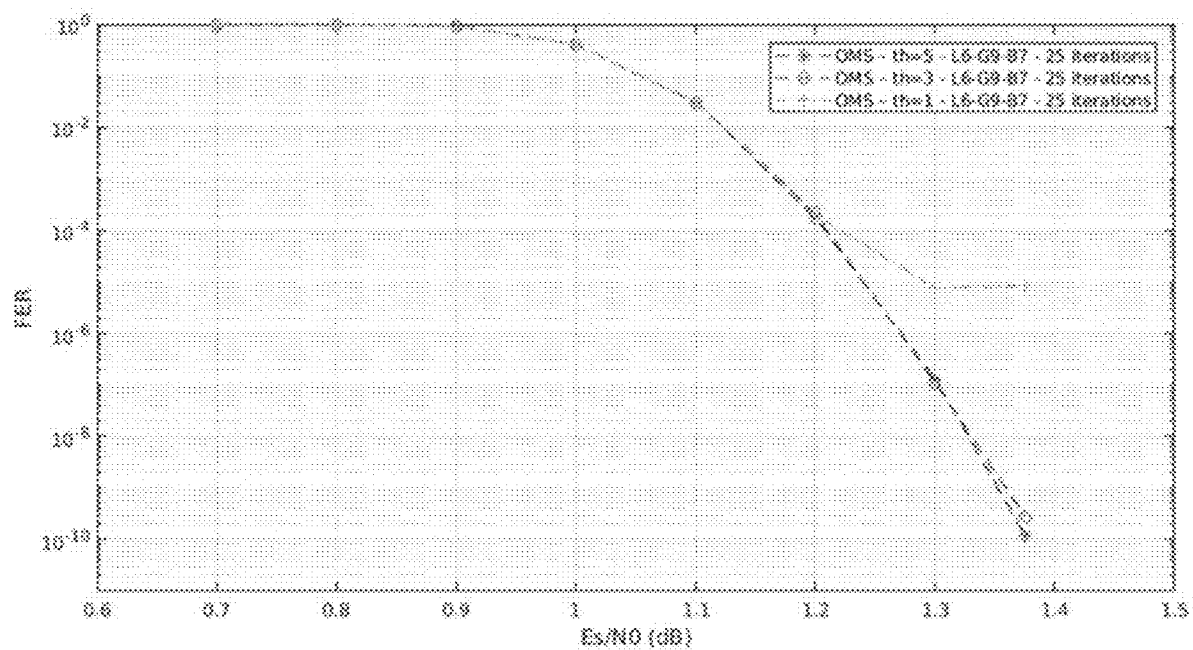
Figure 9:
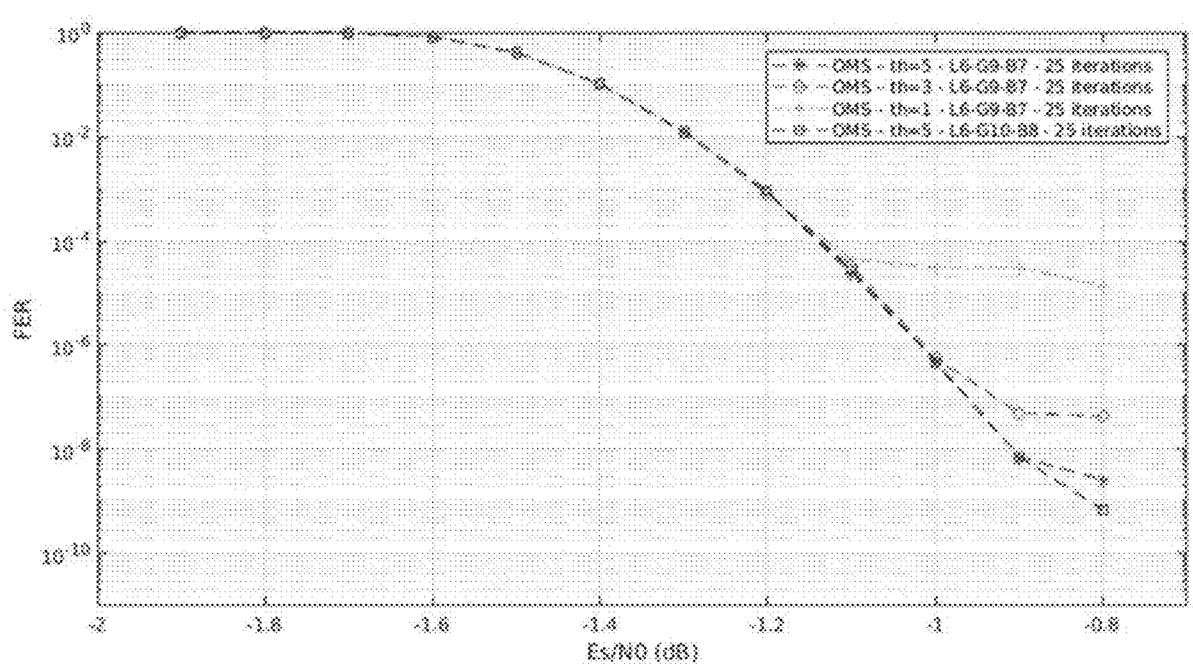
Figure 10:
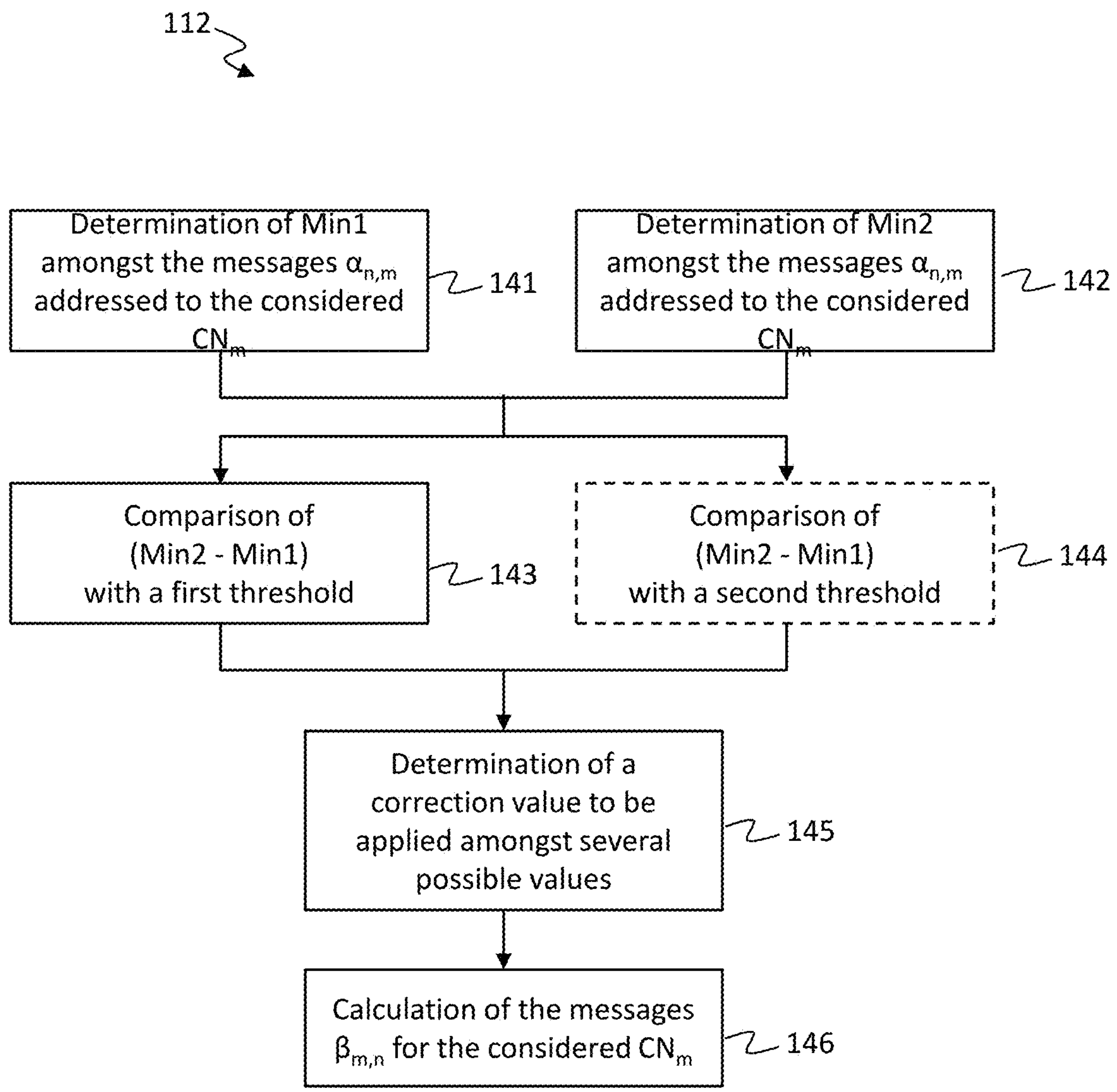
Figure 11:
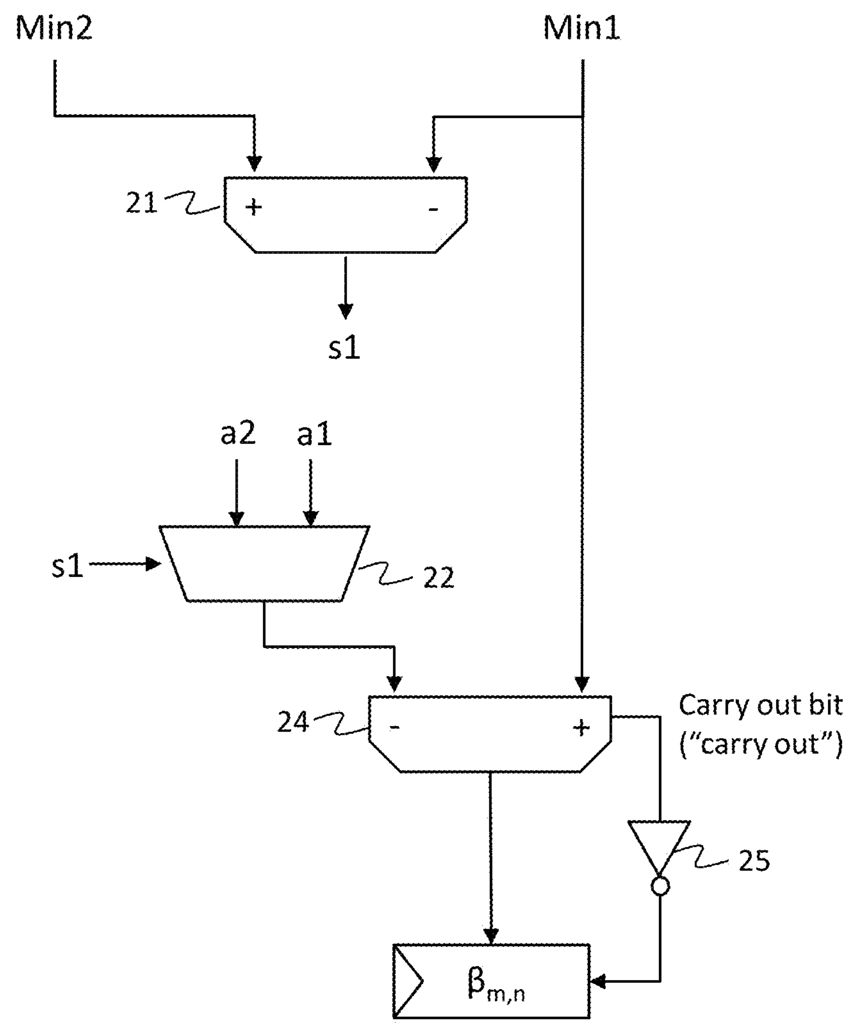
Figure 12:
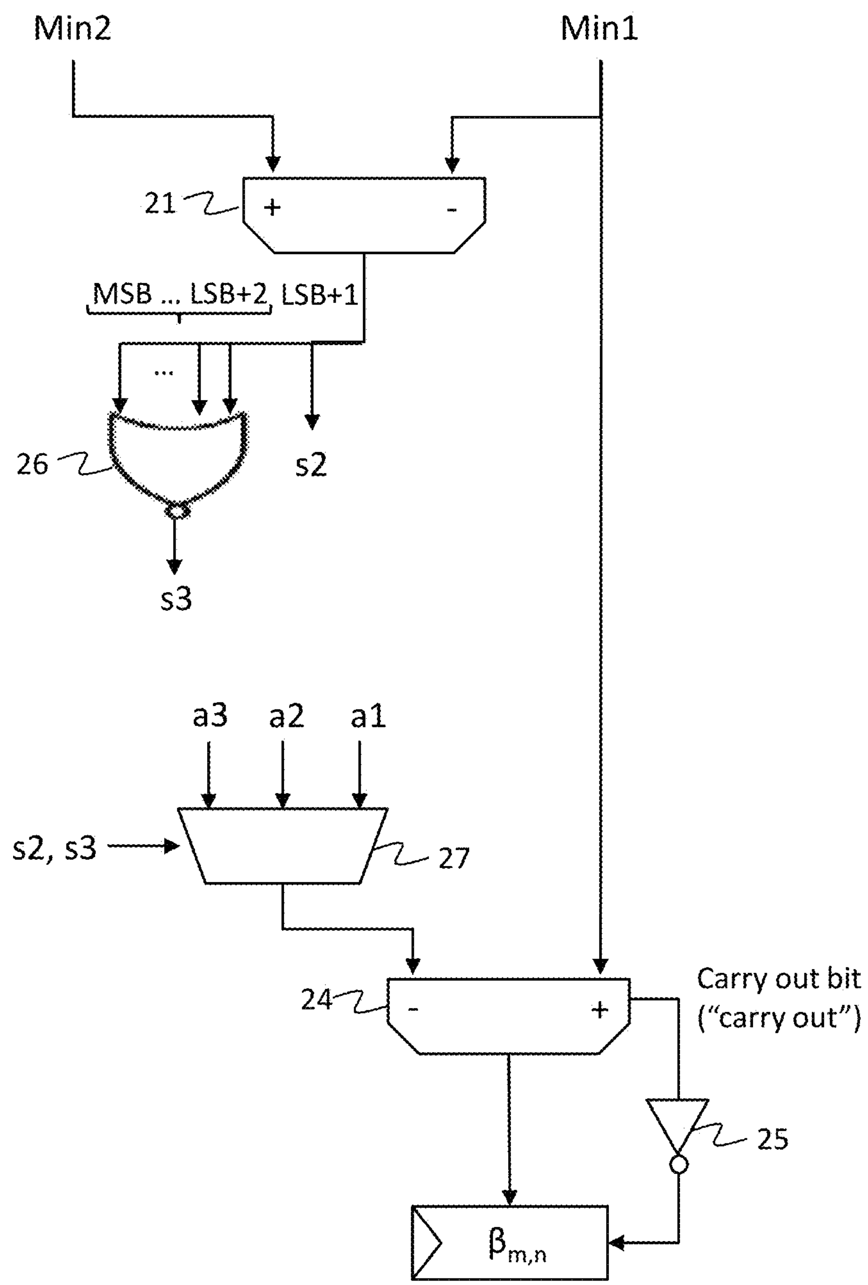
Figure 13:
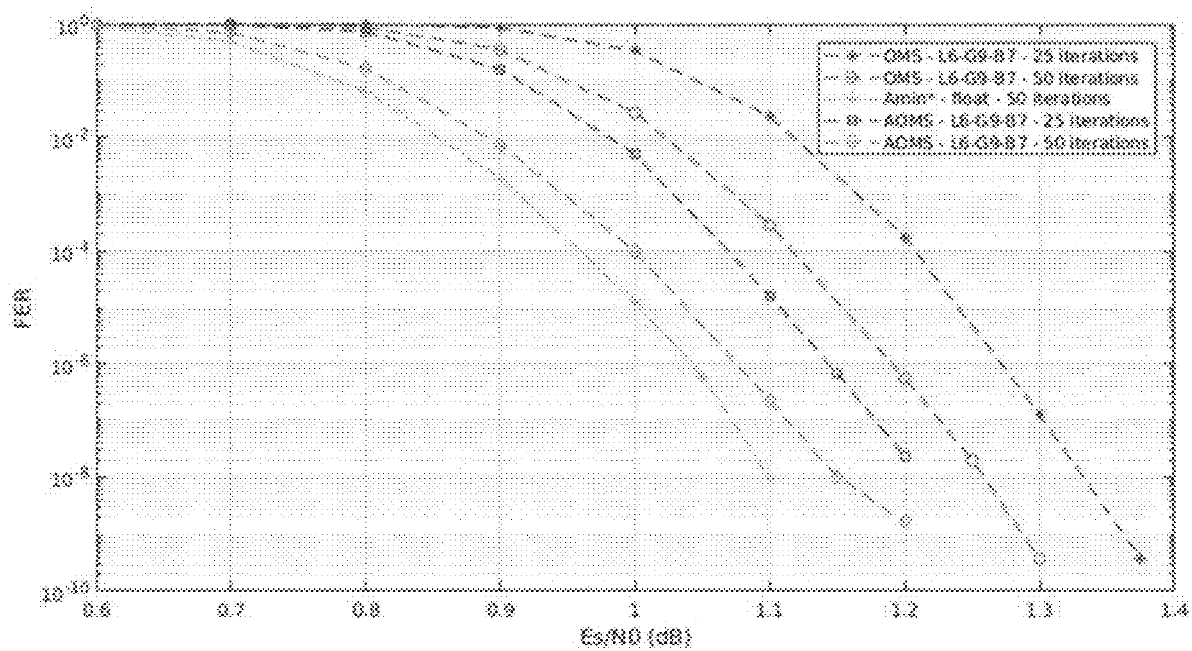
Figure 14:
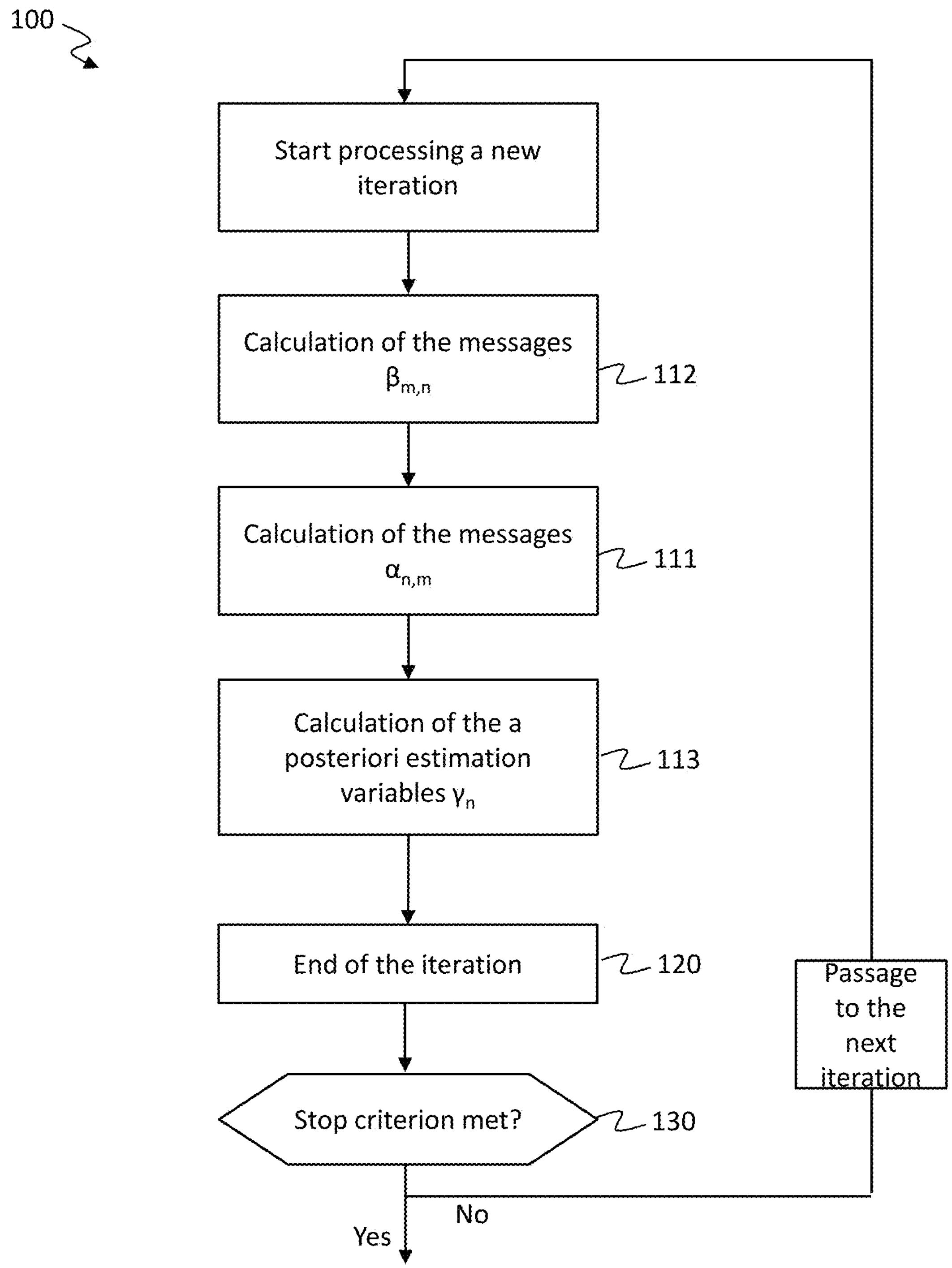
Figure 15:
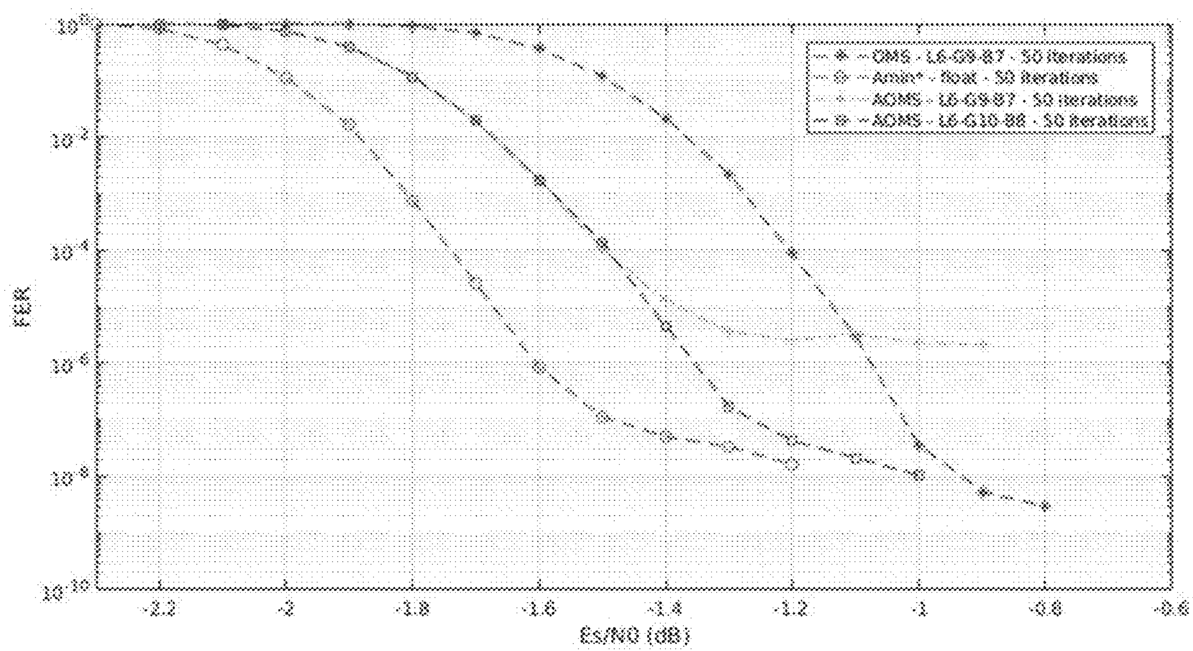
Figure 16:
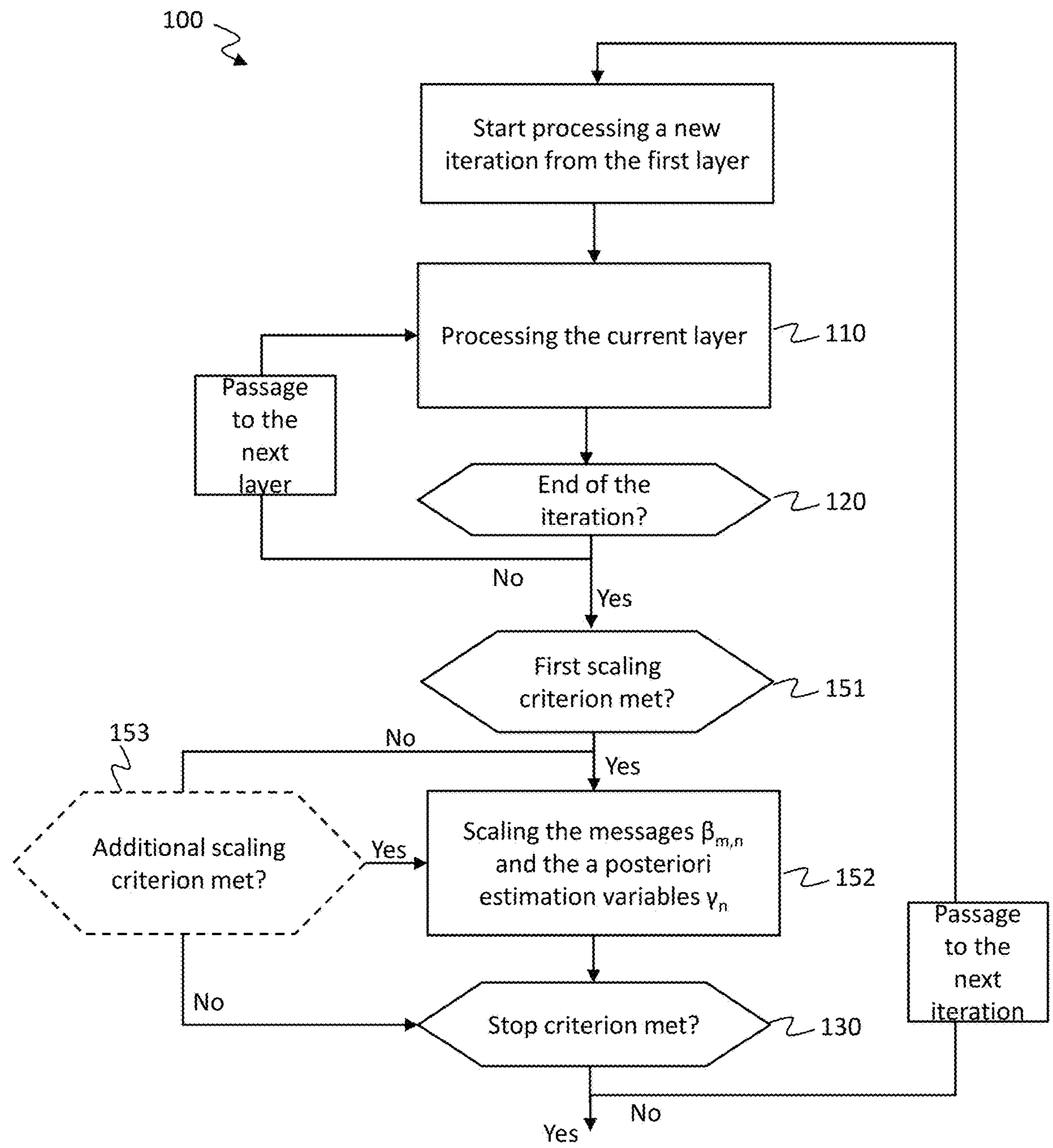
Figure 17:
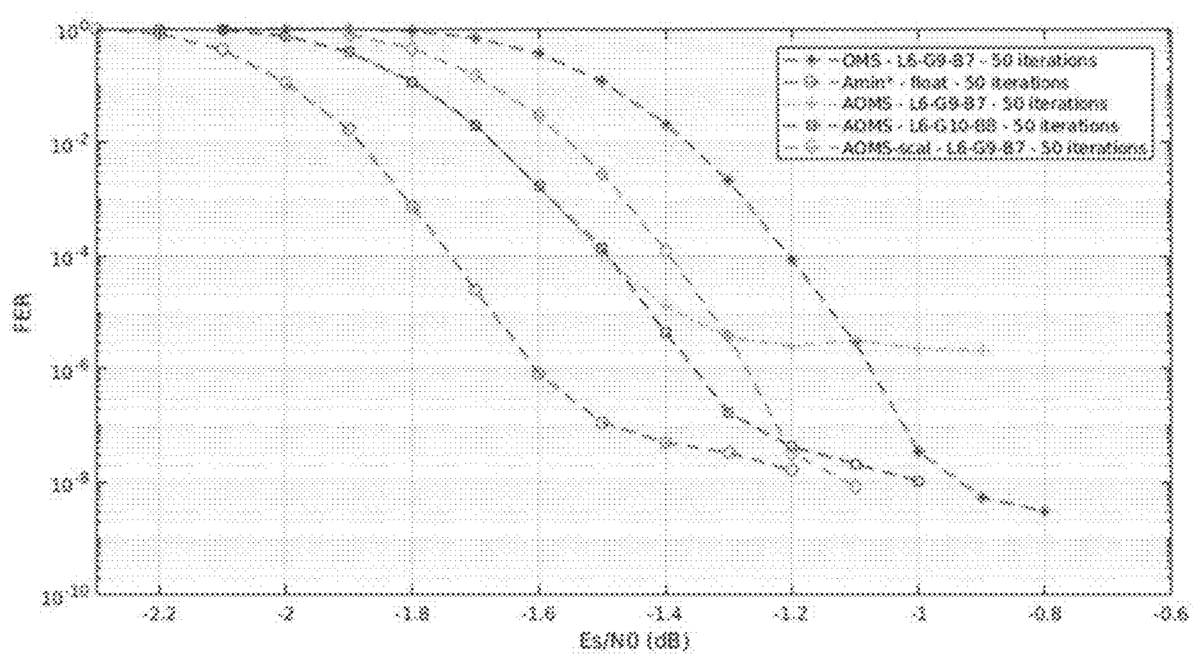
Figure 18:
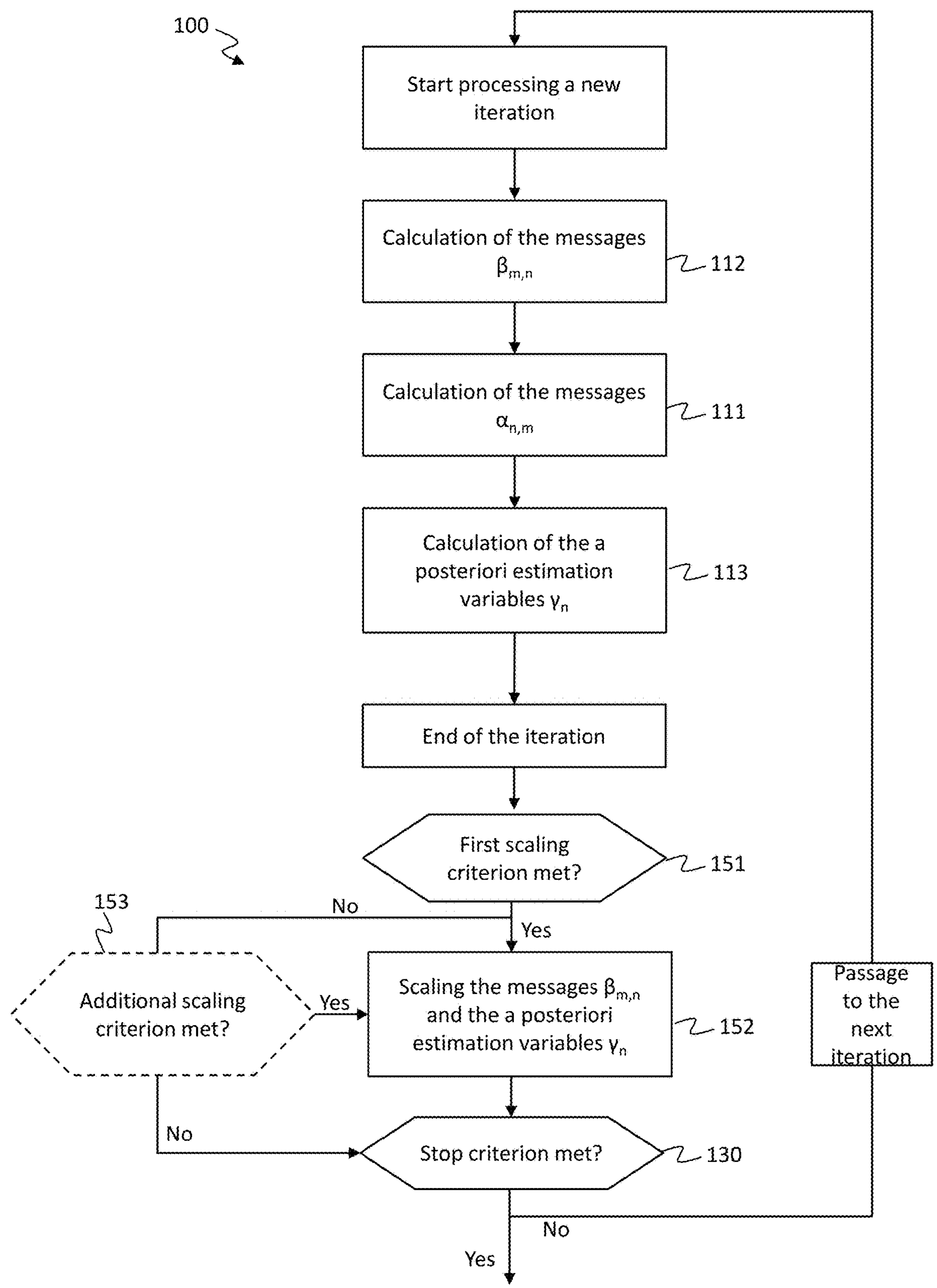

The invention will be better understood upon reading the following description, given as a non-limiting example, and made with reference to FIGS. 1 to 18 which show:

FIG. 1 is a schematic representation of a parity matrix of an LDPC code,

FIG. 2 is a schematic representation of a bipartite graph (Tanner graph) associated with a parity matrix, FIG. 3 is an illustration of a method used to obtain a parity matrix of a quasi-cyclic LDPC code, FIG. 4 is a schematic representation of an example of implementation of a method for decoding an LDPC codeword with layered scheduling, FIG. 5 is a schematic representation of an embodiment of a decoder allowing implementing a decoding method such as that one described with reference to FIG. 4, FIG. 6 is a schematic representation of an example of implementation of an evaluation of a stop criterion according to the invention, FIG. 7 a graph showing different curves of frame error rate obtained for a coding rate equal to 9/10 and for different stop threshold values, FIG. 8 a graph showing different curves of frame error rate obtained for a coding rate equal to ½ and for different stop threshold values, FIG. 9 a graph showing different curves of frame error rate obtained for a coding rate equal to 3/10 and for different stop threshold values, FIG. 10 a schematic representation of an example of implementation of the calculation of a parity check message with the so-called "AOMS" method (English acronym standing for "Adapted Offset Min-Sum"), FIG. 11 is a schematic representation of an example of hardware implementation of the calculation of a parity check message with the AOMS method, FIG. 12 is a schematic representation of another example of hardware implementation of the calculation of a parity check message with the AOMS method, FIG. 13 a graph showing different curves of frame error rate obtained with a coding rate equal to ½, with different methods for calculating a parity check message, and with a maximum number of iterations set at twenty-five or fifty iterations, FIG. 14 is a schematic representation of an example of implementation of an LDPC decoding method with flooding scheduling, FIG. 15 a graph showing different curves of frame error rate obtained with a coding rate equal to 3/10, with different methods for calculating a message, with different levels of quantization of the data, and with a maximum number of iterations set at fifty iterations, FIG. 16 shows an example of implementation of an LDPC decoding method similar to that one described with reference to FIG. 4 with in addition data scaling, FIG. 17 a graph similar to that of FIG. 15 with an additional curve corresponding to the AOMS method with an L6-G9-B7 quantization and with data scaling, FIG. 18 an example of implementation of an LDPC decoding method with flooding scheduling and with data scaling.

In these figures, identical references from one figure to another designate identical or similar elements. For clarity, the illustrated elements are not necessarily plotted to the same scale, unless stated otherwise.

DETAILED DESCRIPTION OF AN EMBODIMENT OF THE INVENTION

In the remainder of the description, without limitation, we consider the case of an LDPC decoder for spatial communications. The CCSDS (English acronym standing for "Consultative Committee for Space Data Systems") is currently defining a standard for optical spatial communications for which LDPC codes have been defined by the company AIRBUS DEFENCE AND SPACE and the National Center of Space Studies (CNES). The invention applies particularly well to this communication standard. Nonetheless, the invention could also be applied to other types of communications, in particular radio communications. The data rates targeted for the considered spatial communications are relatively high, for example higher than 100 Mbit/s, and even higher than 1 Gbit/s, and even higher than 10 Gbit/s. Nonetheless, nothing prevents the invention from applying the invention to a case where the data rate would be lower than these values.

An LDPC code is defined by a parity matrix. FIG. 1 schematically represents a parity matrix H of an LDPC code. In the case of a binary LDPC code is considered. Hence, the parity matrix H is a binary matrix, which means that each element of the matrix H is either a '0' or a '1'. it is considered that the matrix H is an M×N size matrix, with M and N positive integers. Hence, the matrix includes M lines and N columns. The parity matrix H has a low density, this means that the number of elements of the matrix equal to '1' is relatively small in comparison with the total number M×N of elements of the matrix. For example, the number of non-zero elements of the matrix is less than 0.1% of the total number of elements of the matrix.

As illustrated in FIG. 2, an LDPC code may also be represented in the form of a bipartite graph G (Tanner graph) having connections between N variable nodes $VN_n$ (n varying between 1 and N) and M parity check nodes $CN_m$ (m varying between 1 and M). Each non-zero element of the parity matrix H corresponds to a connection between a variable node $VN_n$ and a parity check node $CN_m$. Each line of the parity matrix H corresponds to a parity equation associated with a parity check node $CN_m$. Each column of the parity matrix H corresponds to a variable associated with a variable node $VN_n$. A codeword to be decoded corresponds to a set of values taken respectively by the variables associated with the N variable nodes (this is the set of the estimated values of the bits of the codeword).

A codeword may have a relatively large size, for example a size larger than or equal to 1,000 bits (N≥1,000). In the considered example, the codeword has a size of 30,720 bits (N=30,720) (we consider hereinafter a step of punching some information bits).

We consider the case of an LDPC decoder which supports different coding rates. The coding rate corresponds to the ratio between the number of useful bits in a codeword to the total number of bits of a codeword. The higher the coding rate, the lower the computational complexity and the higher the flow rate will be; in return, the error correction power is lower (and therefore the error rate is higher). Conversely, the lower the coding rate and the higher the error correction power will be (low error rate); in return, the computational complexity is higher and the flow rate is lower.

In the considered example, the number of lines M and the density of the parity matrix depend on the coding rate. For a coding rate of 9/10, M=4,608 and the density amounts to 0.0816%. For a coding rate of ½, M=17,920 and the density amounts to 0.024%. For a coding rate of 3/10, M=23,040 and the density amounts to 0.0213%.

The decoding of a codeword LPDC is based on an iterative exchange of information on the likelihood of the values taken by the bits of the codeword. The decoding iterative process is based on a belief propagation algorithm which is based on an exchange of messages between the variable nodes $VN_n$ and the parity check nodes $CN_m$.

As illustrated in FIG. 2, a message sent by a parity check node $CN_m$ to a variable node $VN_n$ is denoted $\beta_{m,n}$ (we sometimes use the notation $c2V_{m,n}$ to reflect the notion of directing the message of one parity check node to a variable node). The value of a message $\beta_{m,n}$ is calculated at the level of the parity node $CN_m$ for each of the variable nodes $VN_n$ connected to the parity check node $CN_m$ on the graph G.

A message sent by a variable node $VN_n$ to a parity check node $CN_m$ is denoted $\alpha_{n,m}$ (we sometimes use the notation $v2C_{n,m}$ to reflect the notion of directing the message from one variable node to a parity check node). The value of a message $\alpha_{n,m}$ is calculated at the level of a variable node $VN_n$ for each of the parity nodes $CN_m$ connected to the variable node $VN_n$ on the graph G.

This is an iterative process: the messages $\alpha_{n,m}$ are calculated from the previously calculated messages $\beta_{m,n}$, and the messages $\beta_{m,n}$ are calculated from the previously calculated messages $\alpha_{n,m}$. This iterative process takes as input a priori estimation variables of the codeword that correspond for example to log-likelihood ratios (LLR, standing for "Log-Likelihood Ratio" in English). These are values representative of the likelihood that the value of one bit of the codeword is equal to '1' or to '0' (logarithm of the ratio between the likelihood that the value of the bit is equal to 'O' and the likelihood that the value of the bit is equal to '1').

A posteriori estimation variables $\gamma_n$ (n varying from 1 to N) of the bits of the codeword are also calculated iteratively from the messages $\beta_{m,n}$. These values $\gamma_n$ are also representative of the probability of the value of one bit of the codeword being equal to '1' or to '0'. They allow making a decision on the value of each of the bits of the codeword. A syndrome could then be calculated from the estimated values of the bits of the codeword and from the parity equations defined by the parity matrix H. If we denote $c=(C_1, C_2, \ldots, C_N)$ all of the estimated values of the bits of the codeword, then the syndrome s is defined by the matrix equation $s=H*c^T$. A zero syndrome means that the estimated values of the bits of the codeword meet the parity equations.

The algorithm 1 defined in section 2.3.1 of the document Ref1 describes an example of an LDPC decoding iterative process with the BP-SPA algorithm. The algorithm 2 defined in section 2.3.3 of the document Ref1 describes an example of an LDPC decoding iterative process with the Min-Sum algorithm. These conventional algorithms are known to a person skilled in the art.

These two algorithms are described in the case of a flooding scheduling. The messages $\alpha_{n,m}$ and the values $\gamma_n$ are initialized with the a priori estimation variables. Afterwards, at each iteration, the messages $\beta_{m,n}$ are calculated from the messages $\alpha_{n,m}$; the messages $\alpha_{n,m}$ are calculated from the messages $\beta_{m,n}$ and from the a priori estimation variables; the a posteriori estimation variables $\gamma_n$ are calculated from the messages $\beta_{m,n}$ and from the a priori estimation variables. Afterwards, a syndrome may be calculated from the a posteriori estimation variables $\gamma_n$.

To reduce the hardware implementation complexity of the LDPC decoder, it is possible to use particular structures of the parity matrix H which confer on the matrix an organization in horizontal or vertical layers. For example, a horizontal layer of the parity matrix H may be defined as a set of consecutive lines defined such that, for a given variable (i.e. for a given column of the parity matrix H), the layer has only one non-zero element.

This layered structure allows parallelizing the calculations of the parity check messages within a layer because the parity equations of one layer do not involve a variable of the codeword more than once. Indeed, if a layer has only one non-zero element for a given variable, this means that the variable nodes $VN_n$ connected to a parity check node $CN_m$ of one layer are not connected to another parity check node of said layer.

There are different ways for obtaining a parity matrix H having a layered structure. In particular, and as illustrated in FIG. 3, it is possible to obtain a parity matrix H from a R×C size base matrix B by replacing each element of the base matrix B with a Z×Z size matrix corresponding either to a zero matrix, or to the identity matrix, or to an offset-shift of the identity matrix. The parity matrix then includes R×Z lines (M=R×Z) and C×Z columns (N=C×Z). The term Z is generally so-called "expansion factor". The Z×Z size sub-matrices are generally so-called "circulant matrices". The terms R, C and Z are positive integers. An LDPC code defined by such a parity matrix H is so-called "quasi-cyclic" LDPC (QC-LDPC) code.

For example, and as illustrated in FIG. 3, each element of the base matrix B is an integer having the value '−1', '0', or a value lower than Z. An element of the base matrix B having the value '−1' is replaced by the zero matrix; an element of the base matrix B having the value '0' is replaced by the identity matrix; an element of the base matrix B having a value d comprised between 1 and (Z−1) is replaced by an offset-shift by a value d of the identity matrix.

A horizontal layer of the parity matrix H may then be defined as a set of L consecutive lines of the parity matrix H originating from a line of the base matrix B, with L≤Z.

In the considered example, and without limitation, the expansion factor Z is equal to 128.

A QC-LDPC code may also be obtained by a repetition of a protograph (a protograph is a bipartite graph) and permutations, following predetermined rules, of the connection links existing between its nodes (the permutations are defined by circulant matrices).

Many types of LDPC codes correspond to quasi-cyclic codes and/or to juxtapositions and/or to quasi-cyclic code combinations. For example, these may consist of an irregular code of the "accumulate repeat accumulate" type (LDPC ARA code), or of the "irregular repeat accumulate" type (LDPC IRA code), or of the protograph-based Raptor-like type (LDPC PBRL code).

In a horizontal layered architecture, the calculations are centered primarily on the parity check nodes $CN_m$. The number L corresponds to the number of functional units used to execute in parallel the calculations performed at the level of the parity check nodes. When L=Z, the parallelization level is maximum.

A sequencing based on a horizontal layered structure allows doubling the rate of convergence of the decoding process (two times less iterations are needed with a horizontal layered scheduling to reach performances equivalent to those obtained with flooding scheduling). Furthermore, the memory footprint of a decoder based on a layered scheduling is smaller than that of a decoder based on a flooding scheduling because it is not necessary to store the messages $\alpha_{n,m}$. The use of a QC-LPDC code further allows simplifying the permutation network of the decoder by exploiting the linear properties of the rotation operation.

The algorithm 7 defined in section 2.5.2 of the document Ref1 describes an example of an LDPC decoding iterative process with the Min-Sum algorithm in the case of horizontal layered scheduling. The a posteriori estimation variables $\gamma_n$ are initialized with the a priori estimation variables (LLRs). The messages $\beta_{m,n}$ are initialized at zero. Afterwards, at each iteration, the different layers are successively processed. For each layer: the messages $\alpha_{n,m}$ are calculated from the messages $\beta_{m,n}$ and from the a posteriori estimation variables $\gamma_n$; the messages $\beta_{m,n}$ are calculated from the messages $\alpha_{n,m}$; the a posteriori estimation variables $\gamma_n$ are calculated from the messages $\beta_{m,n}$; a partial syndrome could then be calculated from the a posteriori estimation variables $\gamma_n$.

FIG. 4 schematically illustrates an example of implementation of a method 100 for decoding an LDPC codeword with a decoder having a horizontal layered architecture.

As illustrated in FIG. 4, the method 100 comprises executing one or more iteration(s) until a stop criterion is met. Each iteration comprises the successive processing of the layers of the parity matrix H. The processing 110 of a layer comprises:

- calculating 111 variable messages $\alpha_{n,m}$, for the variable nodes $CN_m$ involved in said layer,
- calculating 112 parity check messages $\beta_{m,n}$ for the parity check nodes $CN_m$ involved in said layer,
- calculating 113 the a posteriori estimation variables $\gamma_n$,
- calculating 114 a partial syndrome for said layer.

The calculation 111 of a variable message $\alpha_{n,m}$ is performed for each variable node $VN_n$ involved in the layer being processed and for each of the parity check nodes $CN_m$ connected to said variable node $VN_n$. The messages $\alpha_{n,m}$ are calculated from the current values of the a posteriori estimation variables $\gamma_n$ and from the current values of the parity check messages $\beta_{m,n}$. These current values correspond either to the initialization values (for the first iteration) or to the values calculated during the previous iteration. For example, a message $\alpha_{n,m}$ is calculated such that $\alpha_{n,m}=\gamma_n-\beta_{m,n}$.

The calculation 112 of a parity check message $\beta_{m,n}$ is performed for each parity check node $CN_m$ involved in the layer being processed and for each of the variable nodes $VN_n$ connected to said parity check node $CN_m$. The messages $\beta_{m,n}$ are calculated from the current values of the variable messages $\alpha_{n,m}$. For example, a message $\beta_{m,n}$ is calculated while considering all of the messages $\alpha_{n,m}$ associated with the parity check node $CN_m$ while excluding the message $\alpha_{n,m}$ associated with the variable node $VN_n$; the absolute value of a message $\beta_{m,n}$ is equal to the smallest absolute value of the considered messages $\alpha_{n,m}$; the sign of a message $\beta_{m,n}$ is equal to the product of the signs of the considered messages $\alpha_{n,m}$.

The calculation 113 of a value of the a posteriori estimation variable $\gamma_n$ is performed for each bit of the codeword. For example, the $\gamma_n$ are calculated from the current values of the parity check messages $\beta_{m,n}$ and from the current values of the variable messages $\alpha_{n,m}$ such that $\gamma_n=\alpha_{n,m}+\beta_{m,n}$.

The calculation 114 of a partial syndrome for the layer being processed is performed by applying the parity equations of said layer to the a posteriori estimation variables $\gamma_n$. The partial syndrome is then an L-size vector.

The method 100 includes, at the end of the processing of each layer, checking 120 whether the iteration is completed or not. The iteration is completed when all the layers have been processed.

At the end of an iteration, the method 100 includes evaluating 130 a stop criterion. For example, it is possible to consider that the stop criterion is met when all the partial syndromes calculated respectively for the different layers are zero.

FIG. 5 schematically illustrates an embodiment of a decoder 10 allowing implementing an LDPC decoding method 100 such as that one described with reference to FIG. 4. Nonetheless, it should be noted that there are in the literature numerous possible architectures for the implementation of LDPC decoders having a layered structure. In the example illustrated in FIG. 5, the decoder 10 includes:

- an input buffer memory 11 of the First-In First-Out ("First In First Out" or FIFO in the Anglo-Saxon literature) type for memorizing a data frame while another data frame is being processed,
- an input alignment unit 12 for forming blocks of data bits to be decoded having the size of the parallelization factor L,
- a volatile ("Random Access Memory" or RAM) or non-volatile ("Read-Only Memory" or ROM) memory 13 in which configuration information relating to the LDPC code are memorized, like for example the parity matrix H to be used (which may be memorized in any suitable form),
- a volatile memory 14 in which the current values of the a posteriori estimation variables $\gamma_n$ are memorized,
- a volatile memory 15 in which the current values of the parity check messages $\beta_{m,n}$ are memorized,
- a processing unit 16 configured to execute the iterations of the decoding process, i.e. in particular to implement the permutation network of the decoder (offset-shift operations of the identity matrix), to perform the calculations of the a posteriori estimation variables $\gamma_n$, of the messages $\alpha_{n,m}$ and $\beta_{m,n}$, of the partial syndromes, and to determine whether the stop criterion is met,
- a multiplexer 19 for routing in the memory 14 the values of the a priori estimation variables (for the first iteration) or the values of the a posteriori estimation variables $\gamma_n$ calculated by the processing unit 16 (for the next iterations),
- a volatile memory 17 in which the hard decision values ("hard decision" in the Anglo-Saxon literature) of the bits of the codeword are memorized,
- an output alignment unit 18 for adapting the size of the blocks of decoded data bits to the expected size at the output of the decoder 10.

For example, the decoder 10 is implemented in the form of a specific integrated circuit of the ASIC type (English acronym standing for "Application-Specific Integrated Circuit", or a reprogrammable integrated circuit of the FPGA type (English acronym standing for "Field-Programmable Gate Array").

For example, the decoder 10 is embedded in a receiver device of a payload of a satellite intended to be placed in orbit around the Earth, or in a receiver device of a communication station on the ground.

Stop Criterion:

The known solutions for determining the stop criterion do not always allow obtaining an ideal tradeoff between the decoding performance, the data rate, the implementation complexity and the energy consumption.

The simple solution consisting in checking at the end of an iteration whether all of the partial syndromes calculated respectively for the different layers are zero, leads to relatively high error rate floors (there is no guarantee that the partial syndromes are met by the same codeword because the posteriori estimation variables $\gamma_n$ are updated after the processing of each layer).

The solution consisting in checking whether the partial syndromes of the different layers are all zero for a predetermined number of successive iterations is not always satisfactory, because this could lead to a latency related to an increase in the number of iterations necessary to meet the stop criterion.

A particular solution for evaluating the stop criterion is proposed hereinafter. In this solution, the evaluation 130 of the stop criterion comprises checking, for a plurality of successive iterations, whether the number of iterations for which all the partial syndromes are zero subtracted by the number of iterations for which at least one of the partial syndromes is non-zero is greater than or equal to a predetermined stop threshold. If so is the case, then the stop criterion may be considered to be met.

This solution is relatively barely complex and therefore easy to implement. Furthermore, it allows reaching lower error rate floors in comparison with a counter conventional approach. Indeed, this solution allows filtering the oscillations of the counter which could be observed for low signal-to-noise ratios (SNR, standing for "Signal to Noise Ratio"). This solution offers a better robustness for low coding rates while providing an equivalent convergence speed for the other cases. This solution also allows increasing the convergence speed for low SNRs because it is no longer necessary to oversize the stop threshold in order to obtain an f error rate floor similar to that one obtained with a counter conventional approach.

It should be noted that other conditions could be added to the evaluation 130 of the stop criterion, like for example the condition according to which a minimum number of iterations has already been performed.

FIG. 6 describes a particular mode of implementation of the evaluation 130 of the stop criterion based on this solution. In this particular mode of implementation, a counter is initialized at zero and, at the end of each iteration:

- it is checked (step 131) whether all of the partial syndromes calculated for the different layers during the iteration that has just ended are zero,
- if at least one of the partial syndromes is non-zero, the counter is decremented by one (step 133), unless the counter is equal to zero,
- if all partial syndromes are zero, the counter is incremented (step 132),
- it is checked (step 134) whether the counter is greater than or equal to the stop threshold (the stop criterion is met if so is the case).

Of course, there are other manners for implementing this solution. For example, it is possible to initialize the counter at a predetermined non-zero value, decrement the counter when all the partial syndromes are zero, and increment the counter if at least one of the partial syndromes is not zero and if the counter is strictly less than its initialization value. The stop criterion is then met when the counter becomes equal to zero.

When the decoder supports different coding rates, the value of the stop threshold may be predetermined according to the coding rate used (for example, the lower the coding rate, and the higher the stop threshold will be).

FIGS. 7, 8 and 9 show graphs with different frame error rate (FER, standing for "Frame Error Rate" in English) curves obtained for stop threshold values equal to one (th=1), three (th=3) and five (th=5). The frame error rate (FER) is represented in ordinates. The signal-to-noise ratio (SNR) is represented in abscissas (ES/No represents a ratio between the energy of the signal Es ad the energy of the noise No). To obtain these results, the OMS method is used, the LLRs are quantified over six bits ("L6"), the a posteriori estimation variables $\gamma_n$ are quantified over nine bits ("G9") and the messages $\beta_{m,n}$ are quantified over seven bits ("B7"). The results are given for a maximum number of iterations set at twenty-five (beyond that, the decoding process is interrupted, in practice, this means that the SNR is too low to enable decoding with the used code).

FIG. 7 corresponds to a coding rate equal to 9/10, FIG. 8 corresponds to a coding rate equal to ½ and FIG. 9 corresponds to a coding rate equal to ⅓. One could observe in these figures that an error rate floor lower than 109 is obtained for a stop threshold equal to three for the coding rates 9/10 and ½. On the other hand, for the coding rate 3/10, it is necessary to use a stop threshold equal to five to obtain an error rate floor lower than 108 (and an error rate floor lower than $10^{-9}$ may be obtained for an L6-G10-B8 quantization).

It should be noted that the evaluation 130 of the stop criterion is not necessarily performed at each iteration. For example, the evaluation 130 of the stop criterion may be performed periodically after a given number of successive iterations.

"Adapted Offset Min-Sum" (AOMS) Method:

The methods used in the prior art to calculate the parity check messages $\beta_{m,n}$ do not always allow obtaining an ideal tradeoff between the decoding performance, the data rate and the implementation complexity.

This is why a new method is proposed. The new method is so-called hereinafter "Adapted Offset Min-Sum" or AOMS (an adaptation of the "Offset Min-Sum" method). FIG. 10 describes an example of implementation of the calculation 112 of a parity check message $\beta_{m,n}$ with the AOMS method. The parity check message $\beta_{m,n}$ is calculated for a parity check node $CN_m$ and for a variable node $VN_n$ to which the parity check node $CN_m$ is connected. The calculation 112 comprises:

- determining 141 a first smallest value Min1 amongst the absolute values of the variable messages $\alpha_{n,m}$ associated with the parity check node $CN_m$,
- determining 142 a second smallest value Min2 amongst the absolute values of the variable messages $\alpha_{n,m}$ associated with the parity check node $CN_m$,
- at least one first comparison 143 of the difference between the second smallest value Min2 and the first smallest value Min1 with a first threshold,
- determining 145 a correction value amongst several possible values according to a result of the first comparison,
- calculating 146 the parity check message $\beta_{m,n}$ according to the first smallest value Min1 and the correction value.

In the example illustrated in FIG. 10, the calculation 112 further includes a second comparison 144 (optional) of the difference between the second smallest value Min2 and the first smallest value Min1 with a second threshold.

The number of possible correction values depends on the number of thresholds (and therefore on the number of comparisons) used. For example, with one single comparison with respect to a threshold, the correction value is selected between two possible values; with two comparisons with respect to two distinct thresholds, the correction value is selected between three possible values; etc.

In particular modes of implementation, the first smallest value Min1 and the second smallest value Min2 are determined from among all the absolute values of the variable messages $\alpha_{n,m}$ associated with the parity check node $CN_m$. The index n' then belongs to the set N(m) of indices i of the variable nodes VN; connected to the parity check node $CN_m$.

In particular modes of implementation, the first smallest value Min1 and the second smallest value Min2 are determined from among the absolute values of the variable messages $\alpha_{n,m}$ associated with the parity check node $CN_m$ while excluding the variable message $\alpha_{n,m}$ associated with the variable node $VN_m$. In other words, Min1 and Min2 are the two smallest values among the absolute values of the variable messages $\alpha_{n',m}$ associated with the parity check node $CN_m$ with the index n' belonging to (N(m)−n). The set (N(m)−n) is the set N(m) with the index n excluded. Such arrangements allow obtaining better performances at the expense of a slightly more complex implementation.

For example, the absolute value of the parity check message $\beta_{m,n}$ is calculated by subtracting the selected correction value from the first smallest value Min1. If the obtained value is negative, the value of the parity check message $\beta_{m,n}$ is reset at zero.

FIG. 11 schematically describes an example of implementation of the calculation 112 of a parity check message m,n with the AOMS method. In the considered example illustrated in FIG. 11, a subtractor 21 gives the difference s1 calculated between the values Min2 and Min1. A multiplexer 22 gives a correction value selected amongst two possible values a1 and a2 depending on a comparison between s1 and a threshold. A subtractor 24 gives the difference between Min1 and the selected correction value. The obtained result is then memorized and it corresponds to the absolute value of the parity check message $\beta_{m,n}$. Subtracting the correction values amounts to adding the two's complement of the correction value. The subtractor 24 is configured to detect an underflow ("underflow") during the subtraction. An underflow occurs when Min1 is lower than the correction value. If an underflow occurs, a carry out value ("carry out") takes on the value '0', otherwise the carry out value takes on the value '1'. If an underflow occurs, then the value of $\beta_{m,n}$ is reset at zero. The reset of the value of $\beta_{m,n}$ at zero is commanded through a negation, via the "NOT" logic gate 25, of the carry out value.

FIG. 12 schematically describes a second example of implementation of the calculation 112 of a parity check message $\beta_{m,n}$ with the AOMS method. In the considered example illustrated in FIG. 12, there are two comparisons with two distinct thresholds, and the correction value to be applied is selected from among three possible values a1, a2 and a3.

To simplify the implementation, it is advantageous, for at least one of the comparisons, that the associated threshold be defined such that the decimal representation of its value S could be written in the form:

$$S = 1 + \sum_{n=1}^{N_{LSB}-1} 2^n \quad \text{[Math. 1]}$$

where $NL_{SB}$ is a positive integer (the threshold is then defined by a binary base value only the $NL_{SB}$ least significant bits of which are equal to '1'). Indeed, in this case, the comparison may be carried out by an "OR" gate or by a "NOR" gate taking as input the most significant bits beyond the $N_{LSB}$ least significant bits of the value of the difference between Min2 and Min1.

In the considered example illustrated in FIG. 12, the first threshold is equal to one ($N_{LSB}$=1). The signal s2 corresponds to the second least significant bit of the calculated difference between Min2 and Min1. The second threshold is equal to three ($N_{LSB}$=2). The signal s3 corresponds to the output of a "NOR" gate 26 taking as input the most significant bits beyond the two least significant bits of the value of the difference between Min2 and Min1. This means that s3 amounts to '1' if all of said most significant bits are zero (and in this case the difference between Min2 and Min1 is less than or equal to the second threshold). s3 amounts to '0' if at least one of the most significant bits is non-zero (which means that the difference between Min2 and Min1 is strictly greater than the second threshold).

If s2 amounts to '0' and s3 amounts to '1', then the difference between Min2 and Min1 is less than or equal to the first threshold. If s2 and s3 amount to '1', then the difference between Min2 and Min1 is strictly greater than the first threshold and less than or equal to the second threshold. If s3 amounts to '0', then the difference between Min2 and Min1 is strictly greater than the second threshold.

An "OR" gate could be used instead of the "NOR" gate 26 by inverting the logics (in this case s3 amounts to '1' if at least one amongst the most significant bits is non-zero, and s3 amounts to '0' if all of the most significant bits are zero).

The multiplexer 27 is configured to determine a correction value selected from among three possible values a1, a2 and a3 according to the results s2, s3 of the comparisons. For example, the correction value a1 is selected if the difference between Min2 and Min1 is less than or equal to the first threshold, the correction value a2 is selected if the difference between Min2 and Min1 is strictly greater than the first threshold and less than or equal to the second threshold, and otherwise the correction value a3 is selected.

When the decoder supports different coding rates, the different possible values for the correction value and/or the different threshold values may be predetermined according to the coding rate used. For example, for a coding rate lower than or equal to ½, we use a1=3, a2=2 and a3=0. For a coding rate higher than ½, we use a1=a2=1 and a3=0.

For the low coding rates, using two thresholds and three correction values (instead of one threshold and two correction values) allows significantly improving the decoding performances.

The choice of the correction values may also depend on the quantization strategy of the a priori estimation values (LLRs).

The graph illustrated in FIG. 13 has different frame error rate curves obtained with a decoder using a coding rate equal to ½, with different methods for calculating the messages $\beta_{m,n}$. The frame error rate (FER) is represented in ordinates, the signal-to-noise ratio is represented in abscissas (Es/No). The different considered methods are Amin*(a method from the prior art quite close to the BP-SPA method), OMS ("Offset Min-Sum" method having one single correction value), and AOMS. In the considered example, for the OMS and AOMS methods, a fixed-point representation is used, the LLRs are quantized over six bits ("L6"), the a posteriori estimation variables $\gamma_n$ are quantized over nine bits ("G9") and the messages $\beta_{m,n}$ are quantized over seven bits ("B7"). For the Amin* method, a floating-point representation is used ("float" or "floating point" in English). The results are given for a maximum number of iterations set at twenty-five or at fifty.

One could notice on this graph that the performances obtained with the AOMS method are relatively close to those obtained with the Amin* method. For a frame error rate in the range of 106, the Amin* method has a gain lower than 0.05 dB in terms of SNR in comparison with the AOMS method; in turn, the AOMS method has a gain greater than 0.1 dB in terms of SNR in comparison with the OMS method.

The AOMS method for the calculation of the parity check messages $\beta_{m,n}$ may be used in combination with the specific stop criterion one example of implementation of which is described with reference to FIG. 6. In particular, the AOMS method and the specific stop criterion may be implemented in the LDPC decoding method 100 described in FIG. 4.

Nonetheless, it should be noted that the AOMS method may also be implemented independently of the stop criterion. Also, the LPDC decoding process in which the AOMS method is used should be based on a layered scheduling. For example, it is possible to use the AOMS method for the calculation 112 of the parity check messages $\beta_{m,n}$ in an LPDC decoding by flooding. For example, FIG. 14 describes an example of implementation of an LPDC decoding method 100 with flooding scheduling. It should be noted that with flooding scheduling, the order of calculation 112 of the parity check messages $\beta_{m,n}$ and of calculation 111 of the variable messages $\alpha_{n,m}$ is reversed with respect to a layered scheduling. In a flooding scheduling, the decoding process sequentially alternates the calculation of all of the parity check nodes $CN_m$ and of all of the variable nodes $VN_m$. Besides the memories already described with reference to FIG. 5, the decoder 10 should then also provide for a volatile memory to memorize the current values of the variable messages $\alpha_{n,m}$.

Data Scaling:

When the data used in the decoding process are quantized with a fixed-point representation ad when relatively low coding rates are used, the saturation of the data (saturation of the values $\beta_{m,n}$ and/or $\gamma_n$ when they reach a predetermined maximum value) could lead to error rate floors ("quantization floors"). Hence, the quantization format of the data should be carefully selected in order to lower the quantization floor while limiting the hardware implementation complexity and while preserving the decoding performances.

The graph illustrated in FIG. 15 shows different frame error rate curves obtained with a decoder using a coding rate equal to 3/10, with different methods for calculating the messages $\beta_{m,n}$. The results are given for a maximum number of iterations set at fifty iterations. The different curves allow comparing the results obtained for the Amin* method (floating-point), for the OMS method with an L6-G9-B7 quantization, and for the AOMS method with, on the one hand, an L6-G9-B7 quantization and, on the other hand, an L6-G10-B8 quantization.

One could observe more or less severe quantization floors depending on the method and the quantization rate used. In particular, with the L6-G9-B7 quantization, the AOMS method has a relatively high error rate floor in comparison with the OMS method for low coding rates.

This is why an "on-the-fly quantization" method is proposed hereinafter. FIG. 16 schematically shows an example of implementation of an LDPC decoding method 100 similar to that one described with reference to FIG. 4, wherein at least one data scaling ("scaling" in English) has been added.

As illustrated in FIG. 16, at the end of one iteration, the method 100 includes an evaluation 151 of a criterion for a first scaling of the data.

For example, the evaluation 151 of the criterion may be performed by checking whether one or more of the following conditions is/are met:

- the number of saturations of the parity check messages $\beta_{m,n}$ is greater than or equal to the first saturation threshold,
- the number of saturations of the a posteriori estimation variables $\gamma_n$ is greater than or equal to a second saturation threshold,
- the sum of the number of saturations of the parity check messages $\beta_{m,n}$ and of the number of saturations of the a posteriori estimation variables $\gamma_n$ is greater than or equal to a third saturation threshold.

The different saturation thresholds may have identical or different values.

When the criterion is met, the parity check messages $\beta_{m,n}$ and a posteriori estimation variables $\gamma_n$ are "scaled". It should be noted that the scaling may be performed before the beginning of the next iteration (in this case, it is performed directly during step 152 illustrated in FIG. 16), or during the next iteration (in this case, step 152 corresponds only to the update of an indication signaling that the parity check messages $\beta_{m,n}$ and the a posteriori estimation variables $\gamma_n$ should be updated during the next iteration before the first use thereof).

A scaling 152 corresponds to assigning to a value the integer of the same sign whose absolute value is the closest integer greater than the absolute value of the value divided by two. Such arrangements allow guaranteeing a lower convergence of the sign change of a parity check message $\beta_{m,n}$ or of an a posteriori estimation variable $\gamma_n$. In particular, in the particular cases 1 and −1, the rounding gives respectively 1 and −1 and therefore preserves the change in sign of the considered metric. This is particularly important for the performance of decoding irregular codes (PBRL, IRA, ARA, etc.) with weakly connected and/or punctured nodes.

Optionally, when the AOMS method or another OMS or NMS type method is used, the correction or normalization values could also be scaled.

For this purpose, the processing unit 16 of the decoder 10 implements a saturation counter and a scaling module. Many conventional LDPC decoders already implement saturation modules. Thus, the cost related to the implementation of a counter of the number of saturations is relatively low. The cost related to the implementation of a scaling module is higher but it remains largely acceptable.

It should be noted that an a posteriori estimation variable $\gamma_n$ could be used several times during the same iteration. Nonetheless, the scaling of this variable $\gamma_n$ should be performed only once when a scaling is necessary (at the first reading of the variable $\gamma_n$ during the considered iteration). For this purpose, for each variable $\gamma_n$, it is possible to memorize an information bit indicating whether it is the first reading of said variable $\gamma_n$ for the current iteration.

When the decoder supports different coding rates, the saturation threshold may advantageously be predetermined according to the coding rate used.

As illustrated in FIG. 16, and optionally, the method 100 may also include an evaluation 153 of a criterion for at least one additional scaling 152. For example, the criterion is met after a predetermined number of successive iterations after the first scaling has taken place. Afterwards, other additional scaling operations may optionally be carried out after a predetermined number of successive iterations after the last scaling.

When the decoder supports different coding rates, the predetermined number of successive iterations after which an additional scaling should be done may advantageously be predetermined according to the coding rate use.

The graph illustrated in FIG. 17 is similar to that one described with reference to FIG. 15 with an additional curve ("AOMS-scal") corresponding to the AOMS method with an L6-G9-B7 quantization and with a scaling of the parity check messages $\beta_{m,n}$ and of the a posteriori estimation variables $\gamma_n$. To obtain this curve, the saturation threshold has been set at 2,500 saturated parity check messages $\beta_{m,n}$ (namely about 1.6% of the number of parity check messages $\beta_{m,n}$ calculated per iteration), and the number of successive iterations after which an additional scaling should be performed has been set at four. It appears on this graph that the error rate floor for the AOMS method with an L6-G9-B7 quantization is significantly lowered by the data scaling method. Nonetheless, one could note a slight decrease in performances n terms of SNR at the level of the waterfall of the curve ("waterfall" in English). The data scaling method allows obtaining, with an L6-G9-B7 quantization, performances in terms of error rate floor that are comparable to those of an L6-G10-B8 quantization. This allows for a significant gain on the memory footprint of the decoder at the expense of a relatively low implementation extra cost.

The scaling of the data may be used in combination with the AOMS method and with the specific stop criterion set out before. In particular, the scaling of the data, the AOMS method and the specific stop criterion may be implemented in combination in the LDPC decoding method 100 described in FIG. 16.

When the data scaling is used in combination with the stop criterion, the evaluation of the saturation criterion in step 151 or in step 153 may be performed before (as illustrated in FIG. 16) or after the stop criterion evaluation step 130.

Nonetheless, it should be noted that the scaling method may also be implemented independently of the AOMS method and/or independently of the stop criterion.

Also, it is not necessary for the LDPC decoding process in which the scaling method is used to be based on a layered scheduling. For example, it is possible to use the data scaling method in an LDPC decoding process by flooding. For example, FIG. 18 describes an example of implementation of an LDPC decoding method 100 with flooding scheduling and with data scaling.

The previous description clearly illustrates that, by its different features and their advantages, the present invention achieves the set objectives. In particular, the different proposed solutions (the specific stop criterion, the "Adapted Min-Sum" calculation method, and the data scaling method) allow obtaining new tradeoffs in terms of error rates, implementation complexity, data rate, and energy consumption.

Advantageously, the stop criterion allows improving the robustness of the decoding at low coding rates. It also allows reducing the number of iterations necessary to decode a codeword, which allows increasing the average decoding flow rate and reducing the latency and the energy consumption of the decoder. The AOMS method allows improving the decoding performances of a codeword in comparison with an OMS-type conventional method. In turn, the data scaling method allows lowering the error floor at particularly low frame error rates. The complexity introduced by these different methods in the decoding process remains largely acceptable with regards to the improvements conferred thereby.

Each of the different methods may be used alone or in combination with the others. The stop criterion is specific to a layered scheduling, but the AOMS method and the data scaling method could be applied both to layered scheduling and to flooding ordering.

The invention has been described in the context of an LDPC decoder for spatial communications, and more particularly for high-speed optical communications. Nonetheless, nothing prevents applying all or part of the methods proposed by the invention to LDPC decoders intended for other applications.

The invention claimed is:

1. A method for decoding a codeword with a decoder of low-density parity check code (LDPC) code, said LDPC code being defined by a binary parity matrix of size M×N stored in a memory of the decoder, M and N being positive integers, the parity matrix corresponding to a representation of a bipartite graph comprising connections between M parity check nodes and N variable nodes, each line of the parity matrix corresponding to a parity equation associated with a parity check node, each column of the parity matrix corresponding to a variable associated with a variable node, each non-zero element of the parity matrix corresponding to a connection between a parity check node and a variable node, the codeword to be decoded corresponding to a set of values taken respectively by said variables, the method comprising executing one or more iterations by a processing unit until a stop criterion is met, each iteration comprising:

calculating variable messages, for the different variable nodes, from parity check messages, calculating parity check messages, for the different parity check nodes, from the variable messages, wherein the parity check messages are stored in a first volatile memory of the decoder, when the calculated value of a parity check message or of an a posteriori estimation variable exceeds a predetermined saturation value, saturating said calculated value at said saturation value, calculating a posteriori estimation variables from the parity check messages, wherein the a posteriori estimation variables are stored in a second volatile memory of the decoder, wherein at the end of an iteration, when a saturation criterion is met, the processing unit performs a first scaling of the parity check messages and of the a posteriori estimation variables, a scaling corresponding to assigning to a value the integer with the same sign whose absolute value is the closest integer greater than the absolute value of the value divided by two, the saturation criterion being met when one or more of the following conditions is met:

a number of saturations of the parity check messages is greater than or equal to a first saturation threshold, a number of saturations of the a posteriori estimation variables is greater than or equal to a second saturation threshold, a sum of the number of saturations of the parity check messages and of the number of saturations of the a posteriori estimation variables is greater than or equal to a third saturation threshold, and wherein, when the stop criterion is met, the method comprises outputting a decoded value of the codeword based on current values of the a posteriori estimation variables.

2. The method according to claim 1, further including, following the first scaling of the parity check messages and of the a posteriori estimation variables, a second scaling of the parity check messages and of the a posteriori estimation variables after a predetermined number of successive iterations.

3. The method according to claim 2, in which the decoder supports different coding rates and the predetermined number of successive iterations is predetermined according to the used coding rate.

4. The method according to claim 1, in which the decoder supports different coding rates and the saturation threshold is predetermined according to the used coding rate.

5. The method according to claim 1, wherein the parity matrix has a horizontal layered structure, each layer corresponding to one or more consecutive lines of the parity matrix, each layer having one single non-zero element for a given variable.

6. The method according to claim 1, wherein the LDPC code is a quasi-cyclic code, the parity matrix being obtained by extending a base matrix of size R×C by an expansion factor Z, Z being a positive integer, each element of the base matrix being replaced by a matrix of size Z×Z corresponding either to a zero matrix or to an offset-shift of an identity matrix, the parity matrix including R×Z lines and C×Z columns.

7. The method according to claim 6, wherein the parity matrix has a horizontal layered structure, each layer corresponding to one or more consecutive lines of the parity matrix, each layer having one single non-zero element for a given variable, and wherein each layer corresponds to the Z lines of the parity matrix corresponding to a line of the base matrix.

8. The method according to claim 1, wherein the LDPC code is an irregular code of the "accumulate repeat accumulate" type, so-called LDPC ARA code, or of the "irregular repeat accumulate" type, so-called LPDC IRA code, or of the protograph-based Raptor-like type, so-called LPDC PBRL.

9. The method according to claim 1, wherein N is greater than or equal to 1,000.

10. The method according to claim 1, wherein the decoder is configured to decode a codeword with a flow rate greater than or equal to 100 Mbit/s.

11. A decoder of low-density parity check code (LDPC) code, said LDPC code being defined by a binary parity matrix of size M×N stored in a memory of the decoder, M and N being positive integers, the parity matrix corresponding to a representation of a bipartite graph comprising connections between M parity check nodes and N variable nodes, each line of the parity matrix corresponding to a parity equation associated with a parity check node, each column of the parity matrix corresponding to a variable associated with a variable node, each non-zero element of the parity matrix corresponding to a connection between a parity check node and a variable node, a codeword to be decoded corresponding to a set of values taken respectively by said variables, the decoder including a processing unit configured to execute one or more iterations until a stop criterion is met, to:

calculate variable messages, for the different variable nodes, from parity check messages, calculate parity check messages, for the different parity check nodes, from the variable messages, wherein the parity check messages are stored in a first volatile memory of the decoder, when the calculated value of a parity check message or of an a posteriori estimation variable exceeds a predetermined saturation value, said calculated value is saturated at said saturation value, calculate a posteriori estimation variables from the parity check messages, wherein the a posteriori estimation variables are stored in a second volatile memory of the decoder, wherein, at the end of an iteration, when a saturation criterion is met, the processing unit is configured to perform a first scaling of the parity check messages and of the a posteriori estimation variables, a scaling corresponding to assigning to a value the integer with the same sign whose absolute value is the closest integer greater than the absolute value of the value divided by two, the saturation criterion being met when one or more of the following conditions is met:

a number of saturations of the parity check messages is greater than or equal to a first saturation threshold, a number of saturations of the a posteriori estimation variables is greater than or equal to a second saturation threshold, a sum of the number of saturations of the parity check messages and of the number of saturations of the a posteriori estimation variables is greater than or equal to a third saturation threshold, and wherein, when the stop criterion is met, the processing unit is configured to output a decoded value of the codeword based on current values of the a posteriori estimation variables.

12. The decoder according to claim 11, wherein, following the first scaling of the parity check messages and of the a posteriori estimation variables, the processing unit is configured to perform a second scaling of the parity check messages and of the a posteriori estimation variables after a predetermined number of successive iterations.

13. The decoder according to claim 12, wherein the decoder supports different coding rates and the predetermined number of successive iterations is predetermined according to the used coding rate.

14. The decoder according to claim 13, wherein the decoder supports different coding rates and the saturation threshold is predetermined according to the used coding rate.

15. A satellite including a decoder according to claim 11.

* * * * *